United States Patent
Nakashima

(10) Patent No.: US 6,750,526 B2
(45) Date of Patent: Jun. 15, 2004

(54) SEMICONDUCTOR DEVICE WITH TRENCH ISOLATION HAVING REDUCED LEAK CURRENT

(75) Inventor: Takashi Nakashima, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/152,008

(22) Filed: May 22, 2002

(65) Prior Publication Data

US 2003/0094669 A1 May 22, 2003

(30) Foreign Application Priority Data

Nov. 22, 2001 (JP) ......................... 2001-357529

(51) Int. Cl.$^7$ .............................................. H01L 29/00
(52) U.S. Cl. ............... 257/509; 257/520; 257/E29.019; 438/361; 438/430
(58) Field of Search ................................ 257/509, 520, 257/E29.019; 438/361, 430

(56) References Cited

U.S. PATENT DOCUMENTS

| | | | |
|---|---|---|---|
| 4,104,086 A | 8/1978 | Bondur et al. ............... | 438/433 |
| 4,256,514 A | 3/1981 | Pogge ......................... | 438/361 |
| 4,631,803 A | 12/1986 | Hunter et al. ............... | 438/426 |
| 4,819,052 A | * 4/1989 | Hutter ......................... | 257/378 |
| 4,980,747 A | * 12/1990 | Hutter et al. ................ | 257/513 |
| 5,498,566 A | * 3/1996 | Lee ............................. | 438/425 |
| 5,914,523 A | * 6/1999 | Bashir et al. ................ | 257/520 |
| 5,923,073 A | * 7/1999 | Aoki et al. .................. | 257/501 |
| 6,306,724 B1 | * 10/2001 | Chen ........................... | 438/435 |
| 6,406,972 B2 | * 6/2002 | Norstrom et al. ........... | 438/404 |

FOREIGN PATENT DOCUMENTS

| | | |
|---|---|---|
| JP | 59-149030 | 8/1984 |
| JP | 1-117338 | 5/1989 |
| JP | 4-364755 | 12/1992 |
| JP | 5-283520 | 10/1993 |
| JP | 10-41380 | 2/1998 |

\* cited by examiner

Primary Examiner—Michael S. Lebentritt
Assistant Examiner—Christian D. Wilson
(74) Attorney, Agent, or Firm—McDermott, Will & Emery

(57) ABSTRACT

An N$^-$ type epitaxial layer is formed on a P$^-$ type silicon substrate. Trenches are created so as to penetrate N$^-$ type epitaxial layer and so as to reach to a predetermined depth of P$^-$ type silicon substrate. Thermal oxide films are formed on the sidewalls of trenches. Buried polysilicon films are formed so as to fill in trenches. Thermal oxide films are formed having an approximately constant film thickness ranging from the bottoms to the edges of the openings of trenches so as not to give stress to N$^-$ type epitaxial layers. Thereby, a semiconductor device wherein a leak current is prevented can be gained.

6 Claims, 34 Drawing Sheets

SEMICONDUCTOR DEVICE WITH TRENCH ISOLATION HAVING REDUCED LEAK CURRENT

BACKGROUND OF THE INVENTION

1. Field of the Invention

The present invention relates to a semiconductor device and to a manufacturing method for the same, in particular, to a semiconductor device having a trench for isolation and to a manufacturing method for the same.

2. Description of the Background Art

A variety of isolation structures for electrically insolating elements from each other are utilized at the time when a plurality of predetermined elements, such as bipolar transistors, registers or capacitors, are mounted in a semiconductor integrated circuit (hereinafter referred to as IC). The isolation structure that is most widely utilized is an isolation structure based on a PN junction.

In this isolation structure a PN junction is formed between a region wherein elements are formed (element formation region) and an isolation region of which the conductive type is opposite to that of the element formation region. Then, adjoining element formation regions are electrically isolated from each other by applying a reverse bias to this PN junction.

In a bipolar IC, an N$^-$ type epitaxial layer is allowed to grow on a P$^-$ type semiconductor substrate. In this case, it is necessary to defuse a P type diffusion layer in the depth direction by the film thickness of the N$^-$ type epitaxial layer in order to form an isolation region. At this time, the P type diffusion layer spreads in the lateral direction to approximately the same degree as the film thickness of the N$^-$ type epitaxial layer.

Therefore, an extra distance between an element formation region and an isolation region must be secured by taking the amount of spread in the lateral direction of the above diffusion layer into consideration. In particular, since it is necessary to make the N$^-$ type epitaxial layer thick in a transistor of a high withstand voltage, the isolation region further spreads in the lateral direction so that the area of the semiconductor device that includes the element formation region and the isolation region becomes great.

In order to overcome this defect, a trench isolation structure has been implemented in recent years. In a trench isolation structure a deep trench is created to reach to a predetermined depth in the P$^-$ type semiconductor substrate by penetrating the N$^-$ type epitaxial layer and an insulator is filled in into this trench. Accordingly, a trench isolation structure does not have spread in the lateral direction, unlike in the case of an isolation structure based on a PN junction, and a trench isolation region is formed so as to approximately attain predetermined dimensions so that the density of integration of a semiconductor device can be greatly increased.

In the following, a manufacturing method for a bipolar IC of a trench isolation structure that has an NPN type bipolar transistor is described as a conventional manufacturing method for a semiconductor device.

First, as shown in FIG. 60, an N$^+$ type buried layer 102 is formed on a P type silicon substrate 101. Next, an N$^-$ type epitaxial layer is formed in accordance with an epitaxial growth method. Trenches 106a and 106b are created by carrying out predetermined photomechanical, and other, processes so as to penetrate the N$^-$ type epitaxial layer and so as to reach to a predetermined depth in P type silicon substrate 101. Thereby, N$^-$ type epitaxial layer 103 is divided into three regions, N$^-$ type epitaxial layers 103a to 103c.

Next, reaction products produced during etching at the time of the creation of trenches 106a and 106b are removed by carrying out predetermined wet etching or cleaning processes. After that, a thermal oxide film (not shown), which becomes a sacrificial oxide film, is formed on the surface of trenches 106a and 106b.

Next, boron is implanted through this thermal oxide film at an acceleration voltage of 50 KeV with the dosage amount of $1 \times 10^{14}/cm^2$ and, thereby, channel cut layers 108a and 108b are formed in regions of P$^-$ type silicon substrate 101 located at the bottom of trenches 106a and 106b. After that, the thermal oxide film is removed through wet etching and a thermal oxide film 109 is formed.

Next, as shown in FIG. 61, a polysilicon film 110 is formed on thermal oxide film 109 so as to fill in trenches 106a and 106b. Next, as shown in FIG. 62, buried polysilicon films 110a and 110b are formed by carrying out etching on the entire surface of polysilicon film 110 so as to leave polysilicon film 110 only within trenches 106a and 106b.

Next, as shown in FIG. 63, thermal oxide film 109 is allowed to remain only within trenches 106a and 106b by carrying out wet etching so as to remove thermal oxide film 109 located on N$^-$ type epitaxial layers 103a to 103c. At this time, etching is also carried out on portions of thermal oxide film 109 located on the sidewalls in the vicinity of the edges of the openings of trenches 106a and 106b so that recesses 111a to 111d are created along the sidewalls in the vicinity of the edges of the openings of trenches 106a and 106b.

Next, as shown in FIG. 64, a thermal oxide film 112 is formed on N$^-$ type epitaxial layers 103a to 103c by applying a thermal oxidation process. Through this thermal oxidation process, the exposed surface of buried polysilicon films 110a and 110b is also oxidized.

Accordingly, the surface of buried polysilicon films 110a and 110b and N$^-$ type epitaxial layers 103a to 103c, which are exposed in recesses 111a to 111d, is also oxidized in the upper portions of trenches 106a and 106b so that thick oxide films 109a and 109b are formed between buried polysilicon films 110a, 110b and N$^-$ type epitaxial layers 103a to 103c. Then, recesses 113a to 113d are created through the formation of thick oxide films 109a and 109b in thermal oxide film 112.

Next, as shown in FIG. 65, a collector lead-out layer 114 and a base lead-out layer 116 are, respectively, formed by means of a predetermined gas diffusion method. After that, thermal oxide film 112 is removed and a new thermal oxide film 118 is formed. At this time, in the case that etching of thermal oxide film 112 is carried out to an excessive degree, recesses 113a to 113d are spread so that thicker thermal oxide film is formed on the portions of these recesses 113a to 113d during thermal oxidation at the time of the formation of thermal oxide film 118.

Next, as shown in FIG. 66, a base diffusion layer 121 is formed by implanting boron ions, for example, into N$^-$ type epitaxial layer 103b by means of an ion implantation method. At this time, a thermal oxidation process is also carried out when boron is diffused by means of a thermal treatment (boron drive) and, thereby, the film thickness of thermal oxide film 118 becomes greater.

Next, as shown in FIG. 67, an emitter diffusion layer 124a and a collector diffusion layer 124b are formed on N$^-$ type epitaxial layer 103b. After that, metal silicide layers 127a to 127c, such as of TiSi$_2$, barrier metal layers 128a to 128c, such as of TiN, and metal wires 129a to 129c, such as of AlCu, are, for example, formed. Thereby, an NPN transistor T is completed.

In the above-described conventional manufacturing method for a semiconductor device, however, it is found that the following problems exist. That is to say, when predetermined voltages are applied, respectively, between N⁻ type epitaxial layer 103a and N⁻ type epitaxial layer 103b or between epitaxial layer 103b and N⁻ type epitaxial layer 103c, it is found that a comparatively large amount of leak current occurs with the result that the elements formed in the respective N⁻ type epitaxial layers 103a to 103c can not be sufficiently electrically isolated from each other.

SUMMARY OF THE INVENTION

The present invention is provided to solve the above-described problems and one purpose thereof is to provide a semiconductor device wherein a leak current is prevented while another purpose thereof is to provide a manufacturing method for such a semiconductor device.

The inventors repeated experiments to search for the causes of the leak current and found that the leak current can be greatly reduced by preventing recesses 113a to 113d created in the sidewall portions in the vicinity of the edges of the openings of trenches 106a and 106b for isolation from becoming large and by preventing the film thickness of the thermal oxide film in those portions from becoming great.

Then, the inventors determined that the leak current is caused by local stress given to N⁻ type epitaxial layers 113a to 113c due to comparatively thick silicon oxide films formed in recesses 113a to 113d located along the sidewalls in the vicinity of the edges of the openings of the trenches.

In the following, a semiconductor device according to the invention and the configuration of a manufacturing method for the same are described.

The semiconductor device according to one aspect of the present invention is provided with a semiconductor substrate of a first conductive type having a main surface, a layer of second conductive type, a trench portion, an insulating film and a buried semiconductor region. The layer of the second conductive type is formed on the main surface of the semiconductor substrate of the first conductive type. The trench portion is created so as to penetrate the layer of the second conductive type and to reach to a region of the semiconductor substrate and separates the layer of the second conductive type into one element formation region and another element formation region. The insulating film is formed on the sidewalls of the trench portion. The buried semiconductor region is formed on the insulating film so as to fill in the trench portion. Then, the insulating film, having an approximately uniform film thickness, is formed from the bottom of the trench portion over to the edges of the opening so as not to give any stress to the layer of the second conductive type.

Because of this structure, the insulating film, having an approximately uniform film thickness, formed on the sidewalls of the trench portion is formed from the bottom of the trench portion over to the edges of the opening so as not to give any stress to the layer of the second conductive type and, thereby, the layer of the second conductive type is prevented from being affected by stress. As a result, the leak current that occurs between one element formation region and another element formation region can be reduced so that the elements formed in the respective element formation regions can be electrically isolated.

A manufacturing method for a semiconductor device according to another aspect of the present invention is provided with the following steps. A layer of a second conductive type is formed on a main surface of a semiconductor substrate of a first conductive type. A trench portion is created so as to divide the layer of the second conductive type into one element formation region and another element formation region. A first insulating film is formed on the layer of the second conductive type that includes the sidewalls exposed within the trench portion. A semiconductor film is formed on the first insulating film so as to fill in the trench portion. A buried semiconductor region is formed so that the semiconductor film remains within the trench portion. A thermal treatment is carried out on the first insulating film that is located on the top surface of the layer of second conductive type and, thereby, a second insulating film that is thicker than the first insulating film is formed.

Because of this manufacturing method, a thermal treatment is carried out on the first insulating film that is formed on the layer of the second conductive type that includes the sidewalls exposed within the trench portion and, thereby, no recesses are formed along the sidewalls of the edges of the openings of the trench portion so that a portion of the first insulating film that is located in this portion can be prevented from becoming thicker through the thermal treatment in comparison with the conventional manufacturing method wherein the second insulating film is formed after removing the first insulating film that is located on the layer of the second conductive type. Thereby, an insulating film having an approximately uniform thickness is formed from the bottom of the trench portion over to the edges of the opening so that a stress is prevented from affecting the layer of the second conductive type. As a result, the leak current that occurs between one element formation region and another element formation region is reduced and, thereby, a semiconductor device is gained that can electrically isolate the elements that are formed in the respective element formation regions without fail.

Another manufacturing method for a semiconductor device according to another aspect of the present invention is provided with the following steps. A layer of a second conductive type is formed on a main surface of a semiconductor substrate of a first conductive type. A trench portion is created for dividing the layer of the second conductive type into one element formation region and another element formation region. An oxidation blocking film is formed on sidewalls exposed within the trench portion. A semiconductor film is formed on the oxidation blocking film so as to fill in the trench portion. A buried semiconductor region is formed so that the semiconductor film remains within the trench portion. An insulating film is formed on the layer of the second conductive type by carrying out a thermal treatment.

Because of this manufacturing method, an oxidation blocking film is formed on the sidewalls exposed within the trench portion and, thereby, the portion of the trench portion in the upper portion of the sidewalls is prevented from being oxidized at the time of the thermal treatment so that the layer of the second conductive type is prevented from being affected by stress. As a result, a semiconductor device is gained wherein the leak current that occurs between one element formation region and another element formation region can be reduced so that the elements formed in the respective element formation regions can be electrically isolated without fail.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
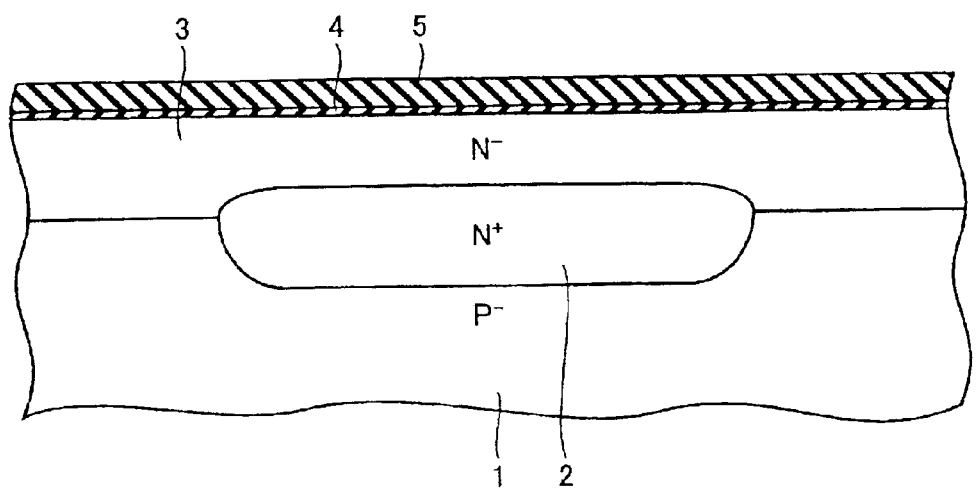
FIG. 1 is a cross sectional view showing one step of a manufacturing method for a semiconductor device according to Embodiment 1 of the present invention.

A manufacturing method for a semiconductor device according to Embodiment 1 of the present invention and a semiconductor device gained in accordance with this manufacturing method are herein described. First, as shown in FIG. 1, an $N^+$ type buried layer 2 is formed on a $P^-$ type silicon substrate 1. $N^+$ type buried layer 2 becomes the low resistance portion of the collector in an NPN transistor. The depth of this $N^+$ type buried layer 2 is approximately 5 $\mu$m.

Next, an $N^-$ type epitaxial layer 3 is formed in accordance with an epitaxial growth method. $N^+$ type buried layer 2 diffuses upward to exceed P type silicon substrate 1 during the epitaxial growth. The film thickness of this $N^-$ type epitaxial layer 3 is approximately 6 $\mu$m. A thermal oxide film 4, of which the film thickness is approximately 0.5 $\mu$m, is formed on this $N^-$ type epitaxial layer 3 in accordance with a thermal oxidation method. A silicon oxide film 5, of which the film thickness is approximately 1 $\mu$m, is formed on this thermal oxide film 4 in accordance with a CVD (chemical vapor deposition) method.

After that, a photoresist (not shown) is applied and patterning is carried out so that openings are created in the photoresist located above the region wherein trenches for isolation are created. Next, reactive anisotropic etching is carried out by using the photoresist as a mask and, thereby, portions of silicon oxide film 5 and thermal oxide film 4 located above the regions in which the trenches are created are removed so that silicon oxide films 5a to 5c and 4a to 4c, which become a mask, are formed (referring to FIG. 2). After that, the photoresist is removed.

Figure 2:
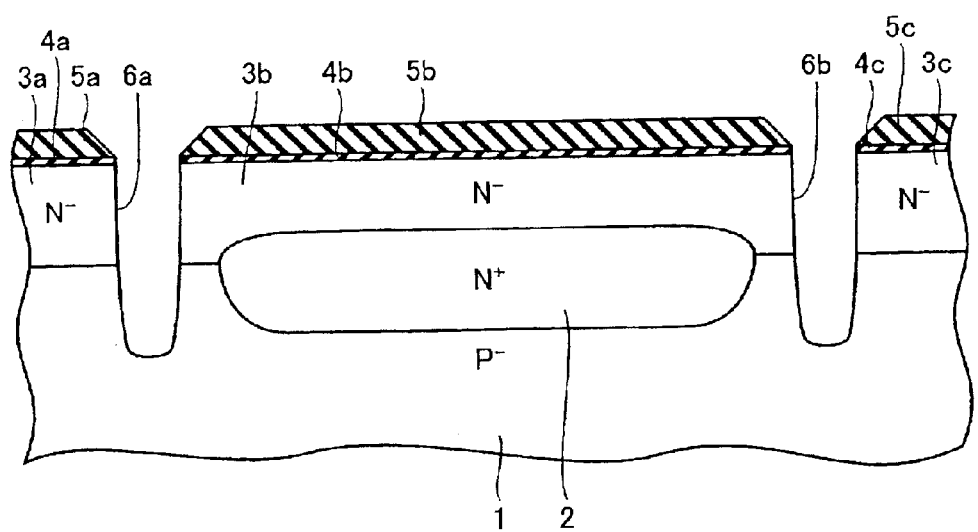
FIG. 2 is a cross sectional view showing a step that is carried out after the step shown in FIG. 1 according to Embodiment 1.

Next, as shown in FIG. 2, reactive anisotropic etching is carried out using silicon oxide films 5a to 5c and 4a to 4c as a mask and, thereby, trenches 6a and 6b are created so as to penetrate $N^-$ type epitaxial layer 3 and so as to reach to a predetermined depth in $P^-$ type silicon substrate 1. The depth of these trenches 6a and 6b is approximately 15 $\mu$m.

These trenches 6a and 6b become isolation regions so as to divide $N^-$ type epitaxial layer 3 into three $N^-$ type epitaxial layers 3a to 3c. Here, the sidewall portions of the openings in silicon oxide films 5a to 5c and 4a to 4c acting as a mask have a tapered form because etching is gradually carried out on the surface of these sidewalls through silicon etching at the time of the creation of trenches 6a and 6b. After that, wet etching and a cleaning process are carried out and, thereby, reaction products that have been produced through silicon etching at the time of the creation of trenches 6a and 6b are removed.

Figure 3:
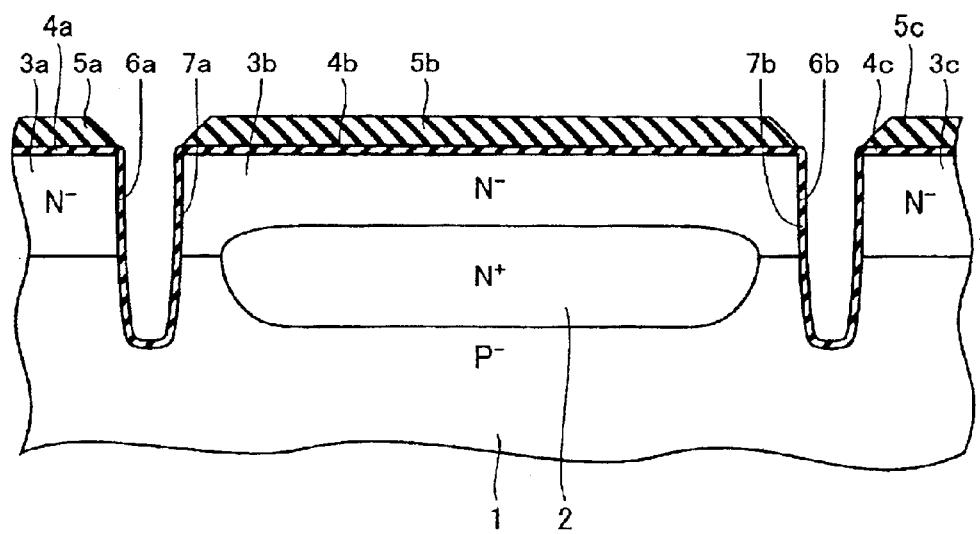
FIG. 3 is a cross sectional view showing a step that is carried out after the step shown in FIG. 2 according to Embodiment 1.

Next, as shown in FIG. 3, thermal oxide films 7a and 7b, of which the film thickness is approximately 50 nm, are formed in accordance with a thermal oxidation method. These thermal oxide films 7a and 7b are so-called sacrificial oxide films. The silicon surfaces of the sidewalls and of the bottoms of trenches 6a and 6b that have received damage through silicon etching are oxidized so that these oxidized portions are subsequently removed.

Figure 4:
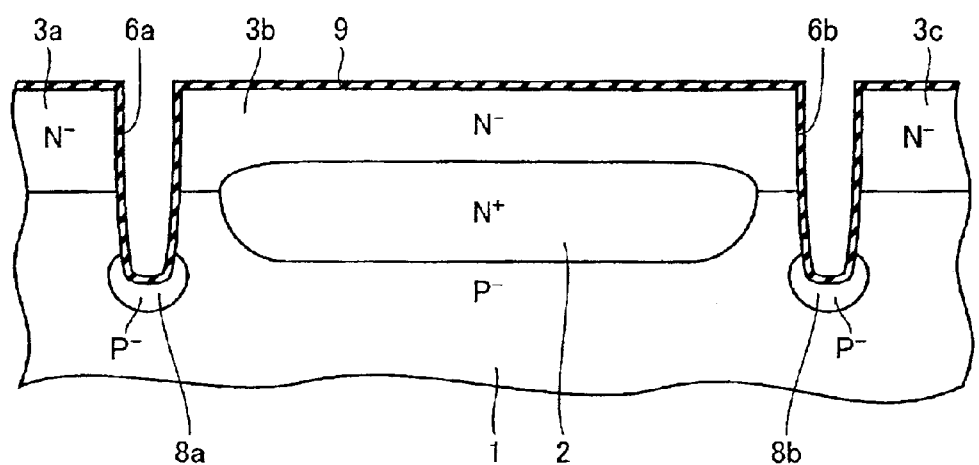
FIG. 4 is a cross sectional view showing a step that is carried out after the step shown in FIG. 3 according to Embodiment 1.

Next, as shown in FIG. 4, boron is implanted at the acceleration voltage of 50 KeV in the dosage amount of $1\times10^{14}/cm^2$ using silicon oxide films 5a to 5c and 4a to 4c as a mask and, thereby, channel cut layers 8a and 8b are formed in the regions of P$^-$ type silicon substrate 1 located at the bottoms of trenches 6a and 6b.

These channel cut layers 8a and 8b are formed in order to prevent the formation of a leak current path between N$^-$ type epitaxial layer 3a and N$^-$ type epitaxial layer 3b or between N$^-$ type epitaxial layer 3b and N$^-$ type epitaxial layer 3c. Next, wet etching is carried out so as to remove silicon oxide films 5a to 5c, 4a to 4c, 7a and 7b. After that, a thermal oxide film 9, of which the film thickness is approximately 0.1 $\mu$m, is formed in accordance with a thermal oxidation method.

Figure 5:
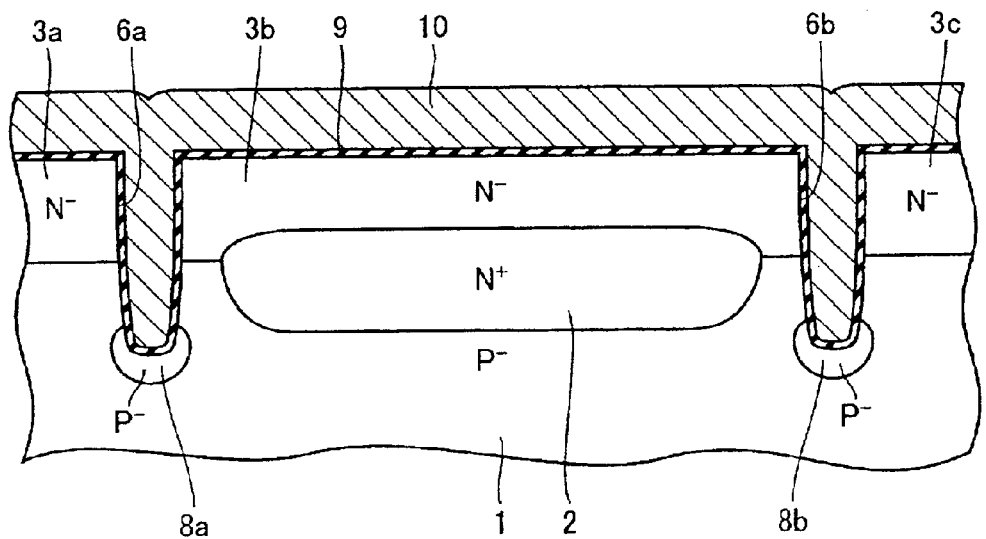
FIG. 5 is a cross sectional view showing a step that is carried out after the step shown in FIG. 4 according to Embodiment 1.
Figure 6:
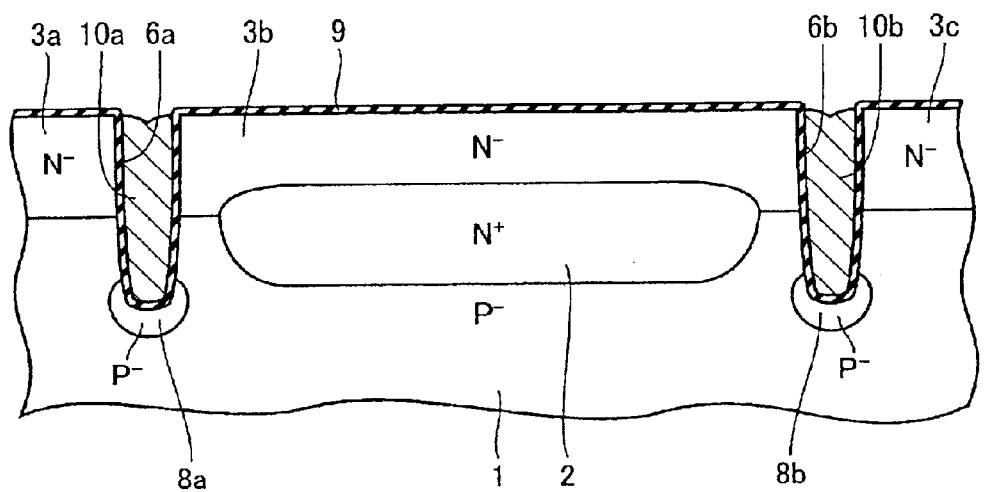
FIG. 6 is a cross sectional view showing a step that is carried out after the step shown in FIG. 5 according to Embodiment 1.

Next, as shown in FIG. 5, a polysilicon film 10, of which the film thickness is approximately 2 $\mu$m, is formed on thermal oxide film 9 so as to fill in trenches 6a and 6b. Next, as shown in FIG. 6, etching is carried out on the entire surface of polysilicon film 10 and, thereby, buried polysilicon films 10a and 10b are formed so that the polysilicon films remain within trenches 6a and 6b.

Etching is carried out on the entire surface of polysilicon film 10 and, thereby, etching is analog carried out on exposed thermal oxide film 9 so that the film thickness (thickness of remaining film) of thermal oxide film 9, which has remained on N$^-$ type epitaxial layers 3a to 3c, is approximately 90 nm. However, the top surfaces of N$^-$ type epitaxial layers 3a to 3c are not exposed.

Here, in the case that an impurity of a predetermined conductive type is added to a polysilicon film, the amount (film thickness) of the polysilicon film that is oxidized in a subsequent oxidation process increases in comparison with the case when the impurity is not added to the polysilicon film. Therefore, as described below, it is preferable to utilize a polysilicon film to which an impurity is not added as polysilicon film 10 in order to reduce the leak current by preventing the film thickness of the thermal oxide film from increasing in the upper portions of the sidewalls of trenches 6a and 6b.

Figure 7:
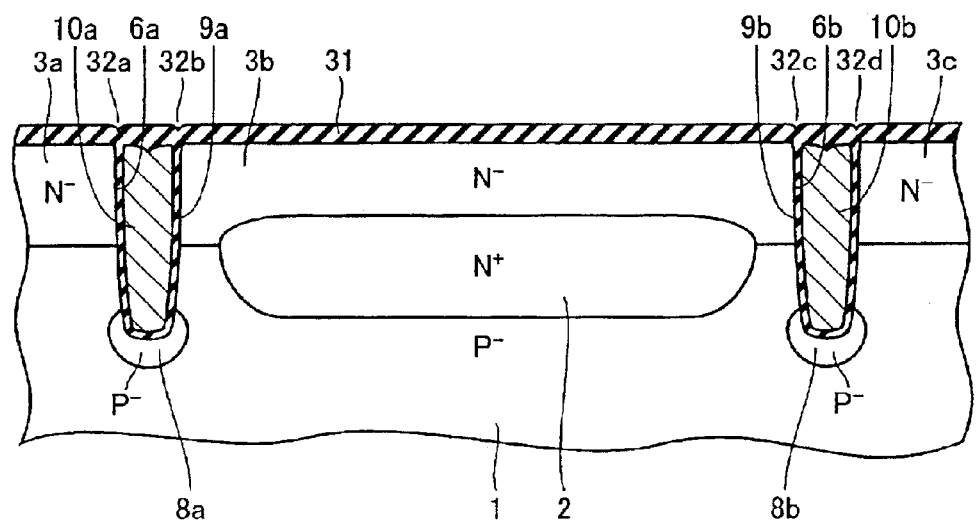
FIG. 7 is a cross sectional view showing a step that is carried out after the step shown in FIG. 6 according to Embodiment 1.

Next, as shown in FIG. 7, a thermal oxide film 31 is formed by carrying out a thermal oxidation process so as to increase the thickness of thermal oxide film 9. This thermal oxide film 31 is formed so that the film thickness thereof becomes approximately 0.6 $\mu$m. This thermal oxide film 31 corresponds to thermal oxide film 112 according to the prior art.

Figure 8:
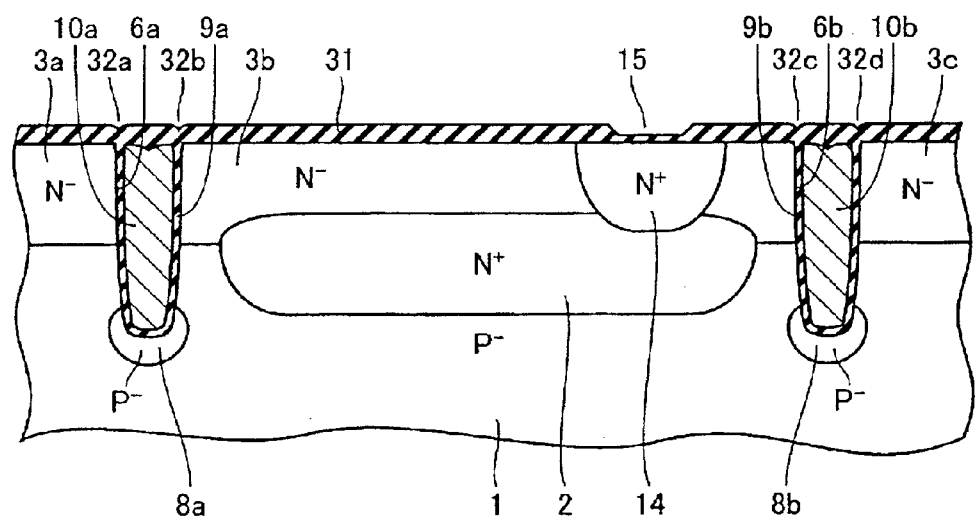
FIG. 8 is a cross sectional view showing a step that is carried out after the step shown in FIG. 7 according to Embodiment 1.

Next, as shown in FIG. 8, phosphorous is introduced to a collector lead-out portion 15 in accordance with a gas diffusion method so as to form a collector lead-out layer 14. A thermal oxidation process is also carried out at the time when the phosphorus is diffused (phosphorus drive) in accordance with a thermal treatment and, thereby, a thermal oxide film, of which the film thickness is approximately 0.4 $\mu$m, is formed in collector lead-out portion 15.

Here, the phosphorus gas diffusion is implemented by carrying out a thermal treatment on the silicon substrate (wafer) for, for example, 10 to 30 minutes while a small amount (up to 1 l/min) of PH$_3$ gas, a small amount (up to 1 l/min) of O$_2$ gas and a large amount (up to 50 l/min) of N$_2$ gas are made to flow in a diffusion furnace at a temperature of, for example, approximately 1000° C.

Figure 9:
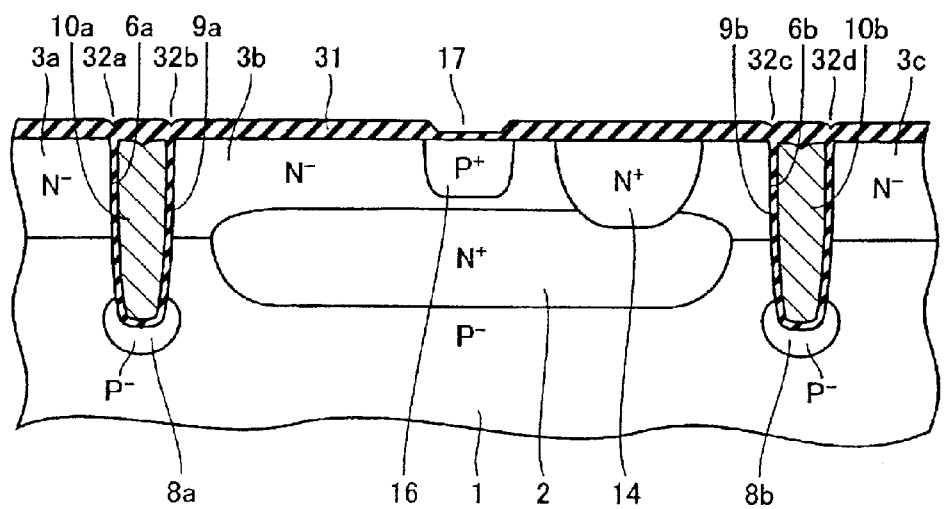
FIG. 9 is a cross sectional view showing a step that is carried out after the step shown in FIG. 8 according to Embodiment 1.

Next, as shown in FIG. 9, boron is introduced into a base lead-out portion 13 in accordance with a gas diffusion method so as to form a base lead-out layer 16. A thermal oxidation process is also carried out at the time when the boron is diffused (boron drive) by means of a thermal treatment and, thereby, a thermal oxide film is formed in a base lead-out portion 17.

Here, the boron gas diffusion is implemented by carrying out a thermal treatment on the silicon substrate (wafer) for, for example, 10 to 30 minutes while a small amount (up to 1 l/min) of B$_2$H$_6$ gas, a small amount (up to 1 l/min) of O$_2$ gas and a large amount (up to 50 l/min) of N$_2$ gas are made to flow in a diffusion furnace at a temperature of, for example, approximately 1000° C.

Next, thermal oxide film 31 is removed by carrying out etching on the entire surface of thermal oxide film 31. At this time, it is necessary to be careful not to allow recesses 32a to 32b in the upper portions of the sidewalls of trenches 6a and 6b to become large by limiting etching of thermal oxide film 31 to the least required amount. Therefore, it is necessary to adopt etching conditions wherein, in the case that the portions of thermal oxide film 31 located above a base diffusion layer 21 formed in a subsequent process can be removed, remaining portions of thermal oxide film 31 are allowed to exist in the other regions.

Concretely, the film thickness of thermal oxide film 31 located above base diffusion layer 21 is measured in advance before etching and the period of time of etching required to remove thermal oxide film 31 is found from the film thickness thereof and the etching rate and, then, etching is carried out so that no portions of thermal oxide film 31 located above this base diffusion layer 21 remain and, thereby, over etching can be reduced to the minimum.

Figure 10:
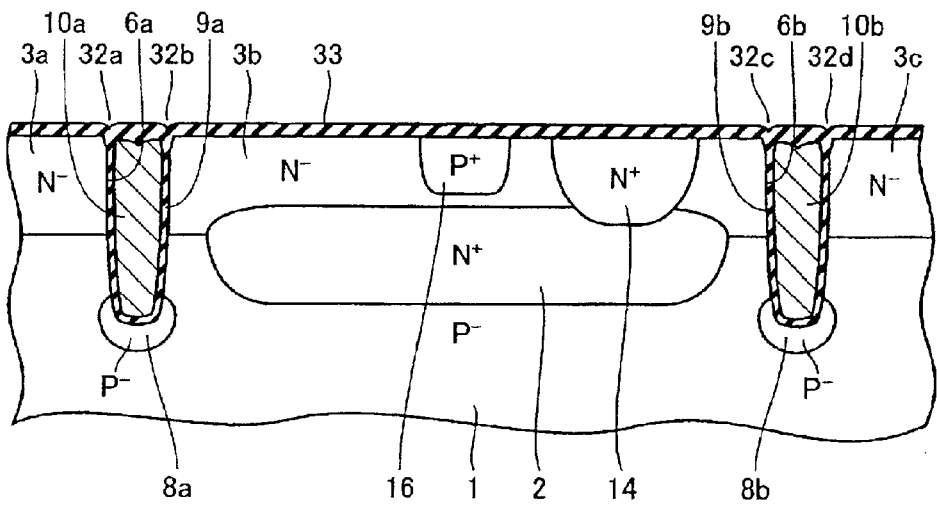
FIG. 10 is a cross sectional view showing a step that is carried out after the step shown in FIG. 9 according to Embodiment 1.
Figure 11:
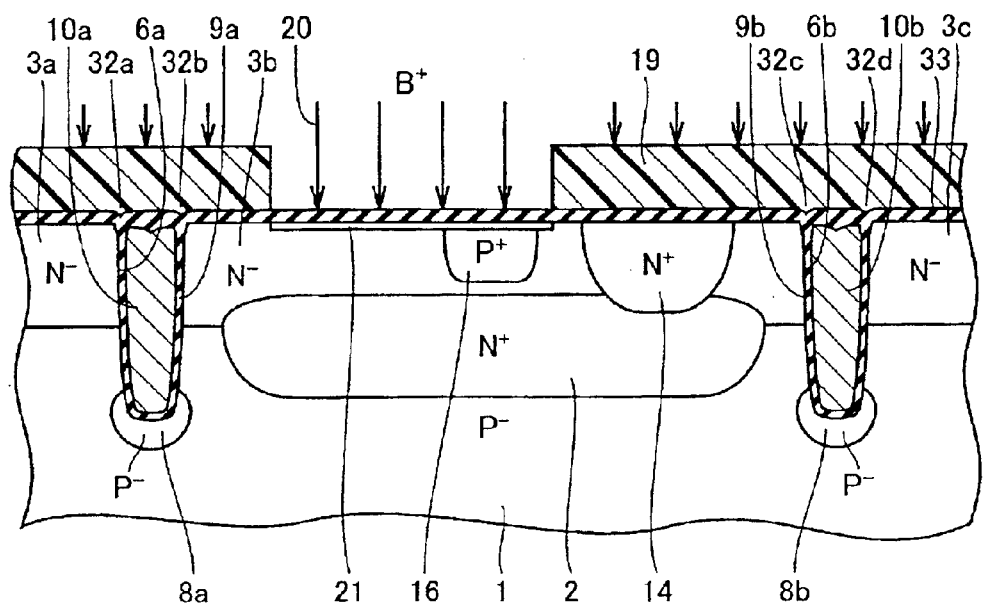
FIG. 11 is a cross sectional view showing a step that is carried out after the step shown in FIG. 10 according to Embodiment 1.

After that, as shown in FIG. 10, a thermal oxide film 33, of which the film thickness is approximately 0.1 $\mu$m, is formed by carrying out a thermal oxidation process. Next, as shown in FIG. 11, a predetermined photoresist 19 is formed on thermal oxide film 33. This photoresist 19 is used as a mask so as to implant boron and, thereby, boron ions are introduced into the surface of N$^-$ type epitaxial layer 3b.

Figure 12:
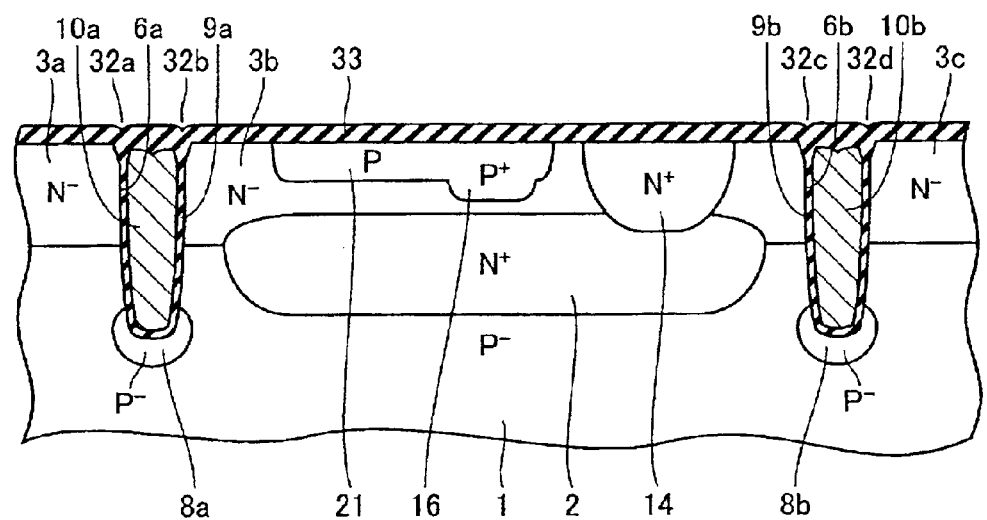
FIG. 12 is a cross sectional view showing a step that is carried out after the step shown in FIG. 11 according to Embodiment 1.
Figure 13:
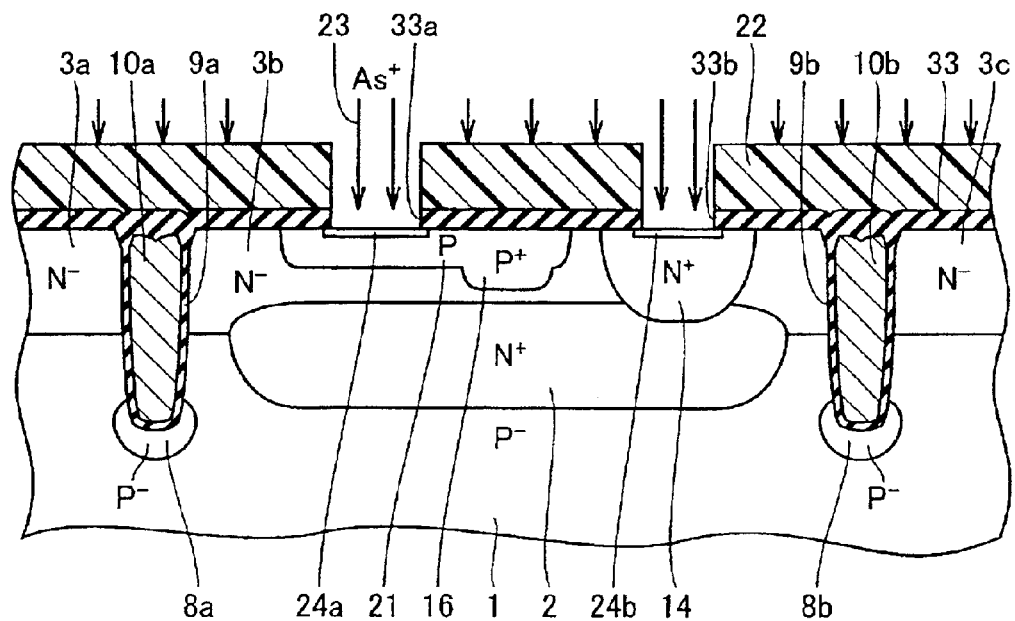
FIG. 13 is a cross sectional view showing a step that is carried out after the step shown in FIG. 12 according to Embodiment 1.

After that, photoresist 19 is removed and a base diffusion layer 21 is formed, as shown in FIG. 12, by diffusing the boron (boron drive) by means of a thermal treatment. Next, as shown in FIG. 13, a photoresist 22 is formed on thermal oxide film 33. This photoresist 22 is used as a mask so as to carry out predetermined anisotropic etching and, thereby, thermal oxide film 33 above the regions that become an emitter region and a collector region is removed so that openings 33a and 33b are, respectively, created.

Figure 14:
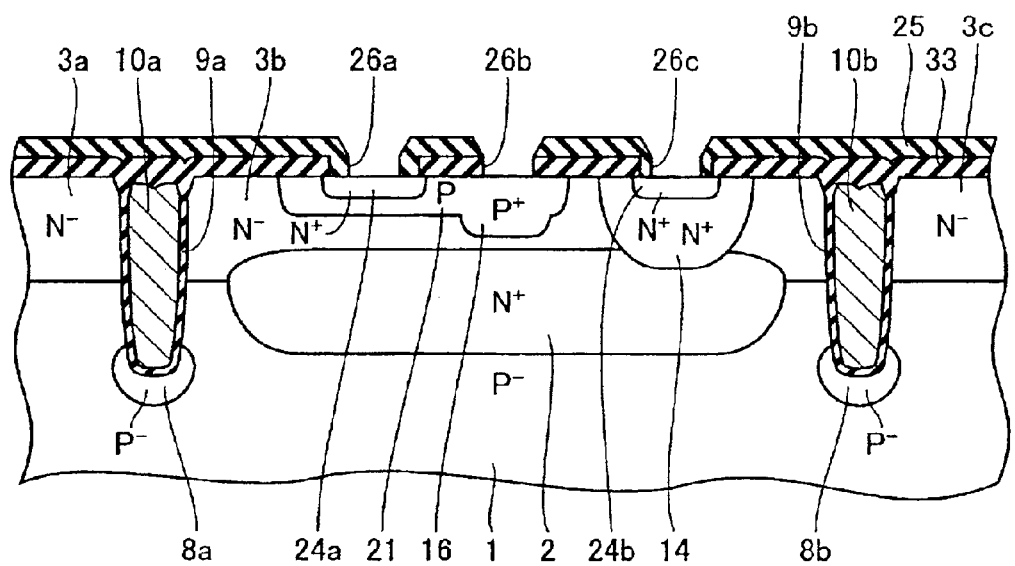
FIG. 14 is a cross sectional view showing a step that is carried out after the step shown in FIG. 13 according to Embodiment 1.

Next, arsenic ions are introduced into the surface of N$^-$ type epitaxial layer 3b by implanting arsenic ions 23. After that, photoresist 22 is removed. Then, an emitter diffusion layer 24a and a collector contact layer 24b are formed as shown in FIG. 14 by diffusing the arsenic (arsenic drive) by means of a thermal treatment.

After that, a silicon oxide film 25 is formed on thermal oxide film 33 by means of a CVD method. Predetermined photomechanical process and etching are carried out on that silicon oxide film 25 and thermal oxide film 33 and, thereby, an emitter contact hole 26a, a base contact hole 26b and a collector contact hole 26c are, respectively, created.

Figure 15:
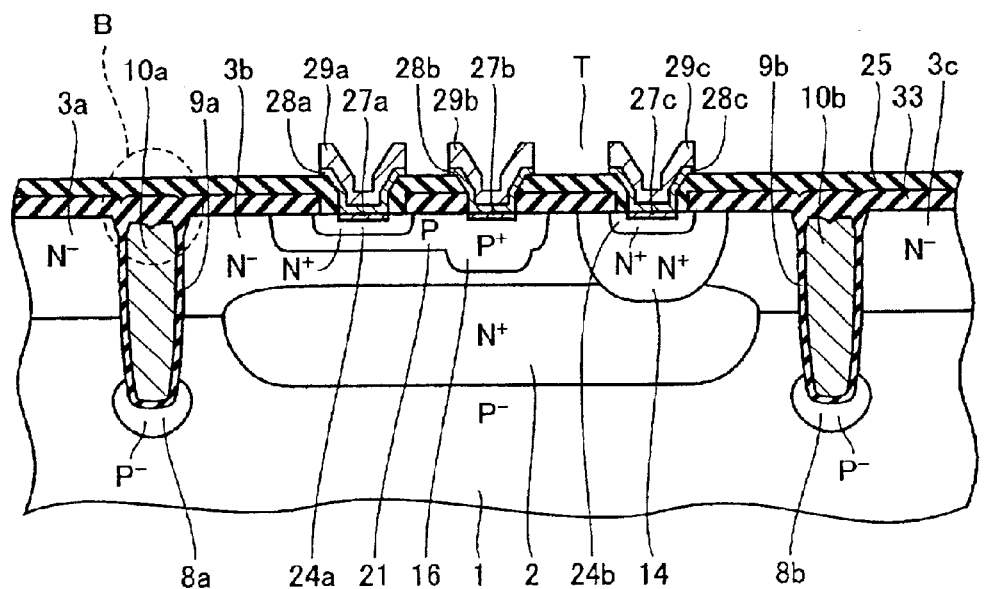
FIG. 15 is a cross sectional view showing a step that is carried out after the step shown in FIG. 14 according to Embodiment 1.

Next, as shown in FIG. 15, metal silicide layers 27a to 27c, such as of TiSi$_2$, barrier metal layers 28a to 28c, such as of TiN, and metal wires 29a to 29c, such as of AlCu, are formed and, thereby, an NPN transistor T is completed.

Figure 63:
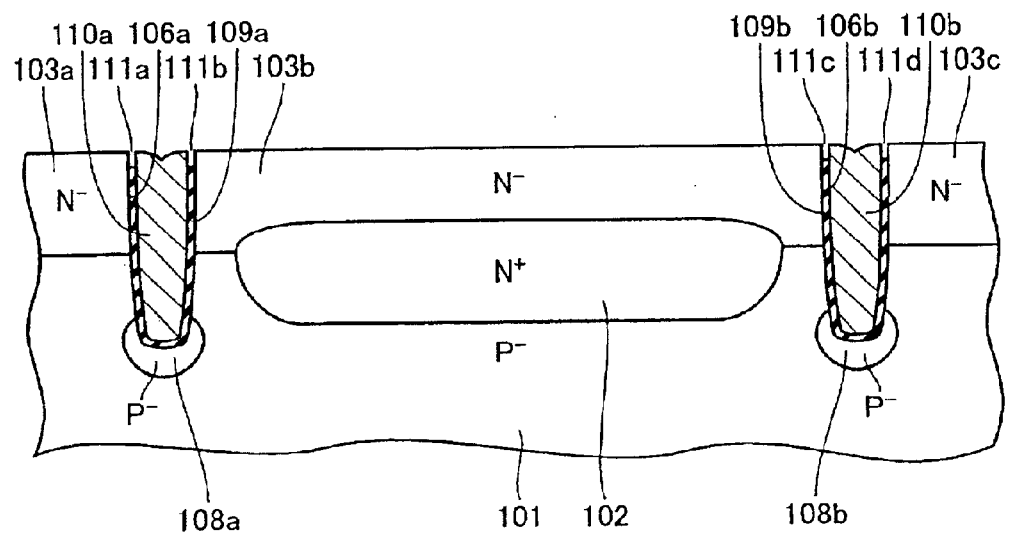
FIG. 63 is a cross sectional view showing a step that is carried out after the step shown in FIG. 62.
Figure 64:
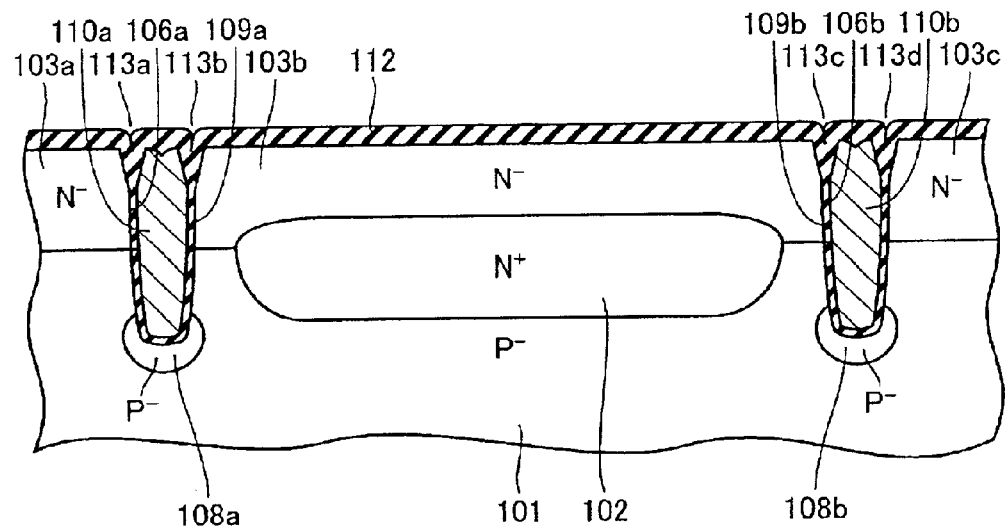
FIG. 64 is a cross sectional view showing a step that is carried out after the step shown in FIG. 63.
Figure 65:
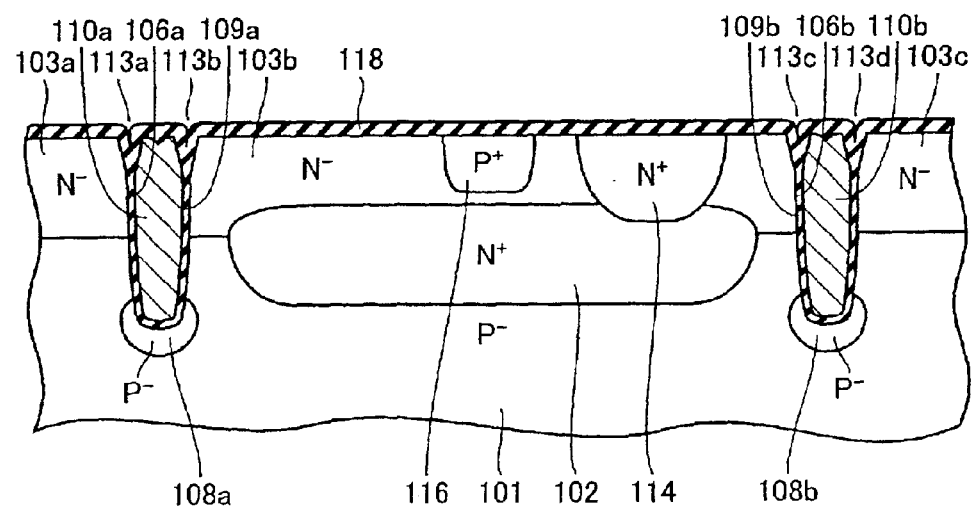
FIG. 65 is a cross sectional view showing a step that is carried out after the step shown in FIG. 64.
Figure 66:
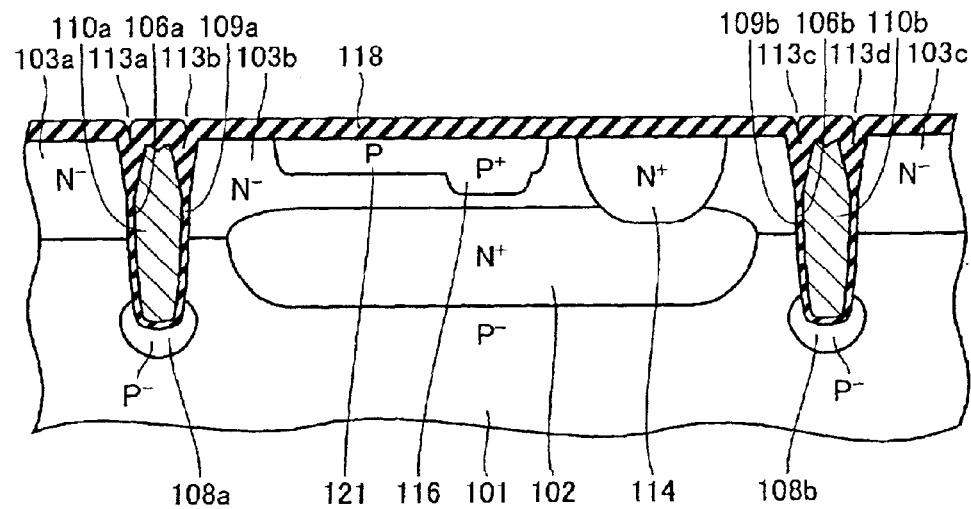
FIG. 66 is a cross sectional view showing a step that is carried out after the step shown in FIG. 65.
Figure 67:
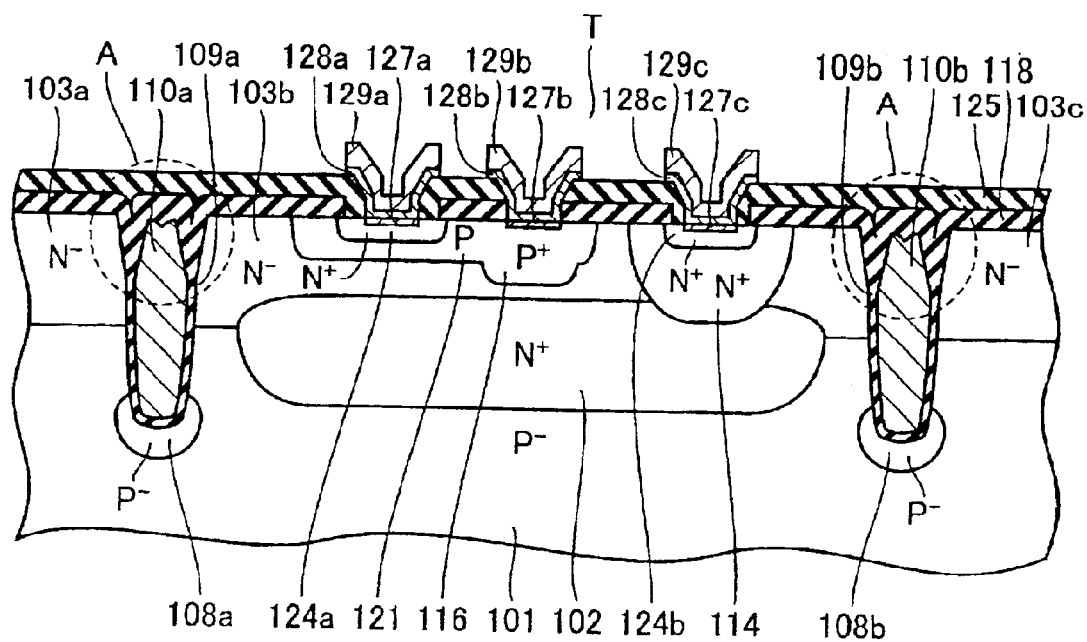
FIG. 67 is a cross sectional view showing a step that is carried out after the step shown in FIG. 66.

In contrast to the conventional manufacturing method for a semiconductor device wherein thermal oxide film 109 located on N$^-$ type epitaxial layers 103a to 103c is removed through etching in the step shown in FIG. 63, etching is not carried out at all on thermal oxide film 9 located on N$^-$ type epitaxial layers 3a to 3c in the steps shown in FIGS. 6 and 7 according to the above-described manufacturing method.

Thereby, in the step shown in FIG. 6, recesses 111a to 111d, as shown in FIG. 63, are not created along the sidewalls in the vicinity of the edges of the openings of trench portions 6a and 6b. Therefore, at the time of thermal oxidation processing carried out for forming thermal oxide film 31 in the next step shown in FIG. 7, the portions of thermal oxide films 109a and 109b located on the sidewalls in the vicinity of the openings of trenches 106a and 106b are prevented from becoming thicker due to the oxidation of the portions of N⁻ type epitaxial layers 103a to 103c and the portions of buried polysilicon films 110a and 110b that are exposed in recesses 111a to 111d, unlike in the conventional manufacturing method.

Accordingly, recesses 32a to 32d that are formed in thermal oxide film 31 located on the sidewalls in the vicinity of the edges of the openings of trenches 6a and 6b become small in comparison with those in the conventional manufacturing method.

Then, according to this manufacturing method for a semiconductor device, etching is further carried out on thermal oxide film 31 to the required minimum amount so that the portion of thermal oxide film 31 located above base diffusion layer 21 can be removed immediately after the step shown in FIG. 9 and, after that, a thermal treatment is carried out for the formation of thermal oxide film 33 in the step shown in FIG. 10.

Thereby, excessive etching is not carried out in recesses 32a to 32d formed in thermal oxide film 31, so that recesses 32a to 32d are prevented from becoming large. Since recesses 32a to 32d are prevented from becoming large, recesses 32a to 32d created in thermal oxide film 33 also become small.

Thus, according to the present manufacturing method for a semiconductor device, etching is not carried out at all on thermal oxide film 9 located on N⁻ type epitaxial layers 3a to 3c and, thereby, large recesses are prevented from being created along the sidewalls in the vicinity of the edges of the openings of trenches 6a and 6b.

Thereby, the portions of thermal oxide film 9a and 9b located on the sidewalls in the vicinity of the edges of the openings are prevented from becoming thick at the time of the formation of thermal oxide film 31 so that recesses 32a to 32d that occur in the portions of thermal oxide film 31 located on these sidewalls also become smaller.

Furthermore, since predetermined etching is carried out on thermal oxide film 31 to the required minimum amount, recesses 32a to 32d are prevented from becoming large so that recesses 32a to 32d that occur in subsequently formed thermal oxide film 33 also become small.

Thereby, thermal oxide films 9a and 9b extending from the bottoms of trenches 6a and 6b over to the edges of the openings are formed so as to have a substantially uniform film thickness in the completed semiconductor device.

Figure 16:
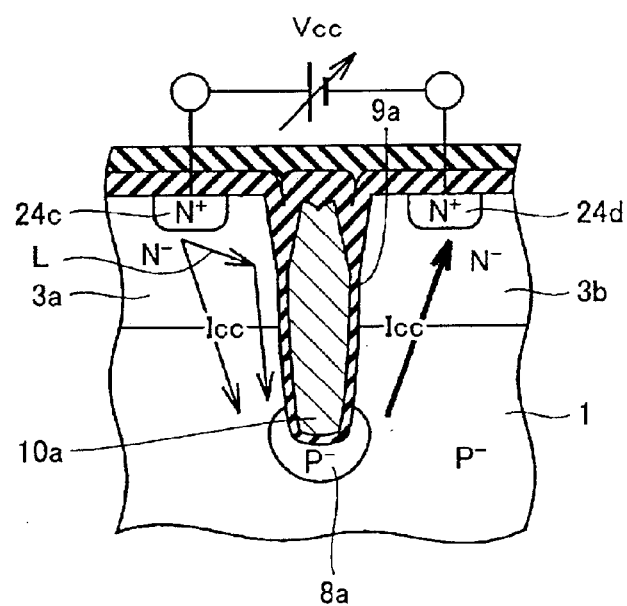
FIG. 16 is a schematic diagram showing a path of a leak current in Embodiment 1.
Figure 17:
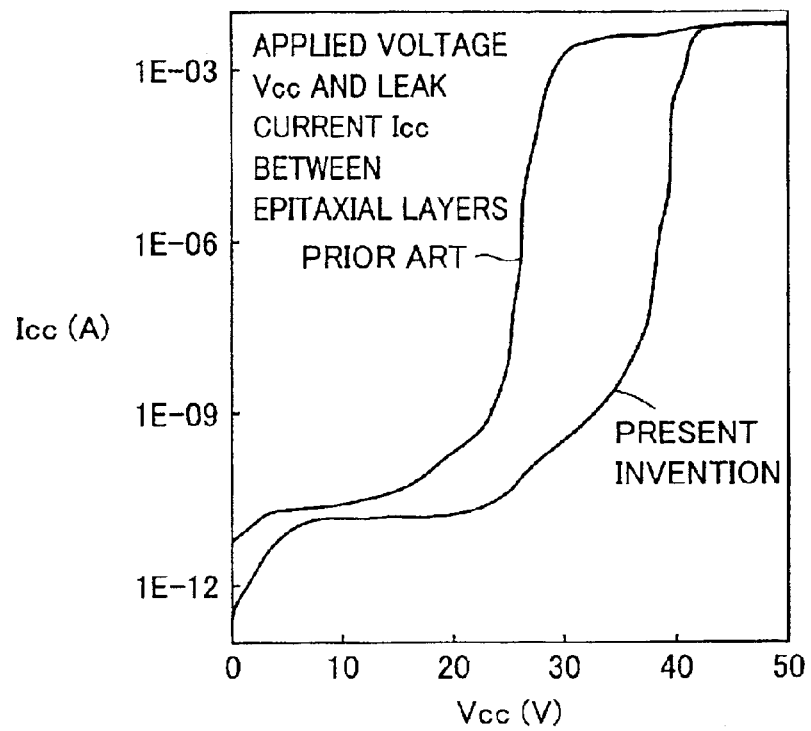
FIG. 17 is a graph showing the relationship between the voltage applied between the epitaxial layers and the leak current in Embodiment 1.

An evaluation of the leak current is carried out in the semiconductor device formed in the above-described manner as well as in the conventional semiconductor device. The result thereof is shown in FIGS. 16 and 17. FIG. 16 shows a path (arrow) of a leak current $I_{CC}$ in the case that a voltage $V_{CC}$ is applied between N⁻ type epitaxial layer 3a and N⁻ type epitaxial layer 3b that are electrically isolated by trench 6a. In the conventional semiconductor device, as shown in FIG. 16, a component L of the leak current that flows through the portion of N⁻ type epitaxial layer 3a located in the vicinity of the edges of the opening of trench 6a is recognized.

In contrast to this, in the semiconductor device gained according to the present manufacturing method, the film thickness of the thermal oxide film located on the sidewalls in the vicinity of the edges of the opening of trench 6a is prevented from becoming great, as shown in B of FIG. 15. Therefore, the stress to N⁻ type epitaxial layer 3a in this portion is relieved.

As a result of this, it is found that component L of the above-described leak current that flows through the N⁻ type epitaxial layer in the vicinity of the edge of the opening is reduced and, as shown in FIG. 17, leak current $I_{CC}$ is reduced in the present semiconductor device in comparison with the conventional semiconductor device for the same applied voltage $V_{CC}$.

In accordance with the above description, it is contemplated that thermal oxide films 9a and 9b extending from the bottoms of trenches 6a and 6b over to the edges of the openings are formed so as to have an approximately constant film thickness so that stress is not given to N⁻ type epitaxial layers 3a to 3c.

Embodiment 2

Figure 18:
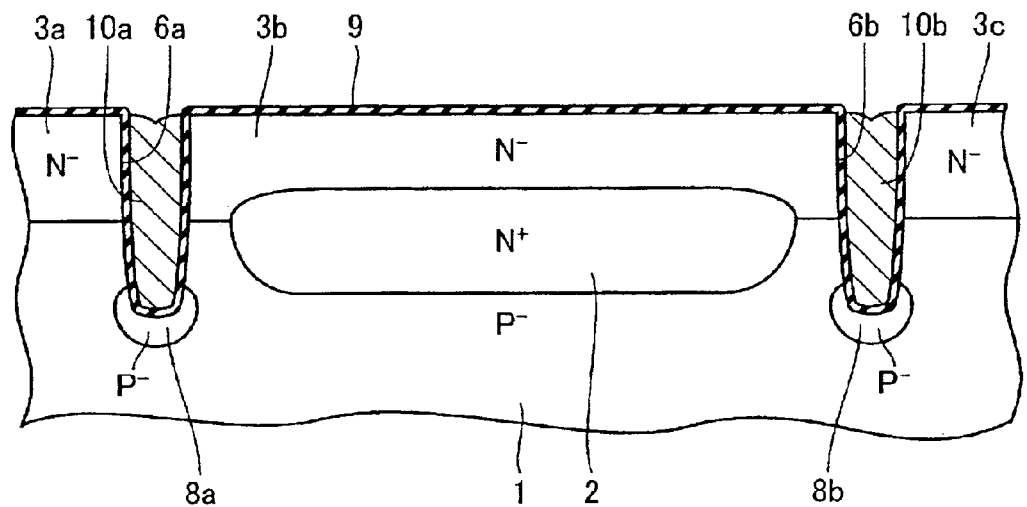
FIG. 18 is a cross sectional view showing one step of a manufacturing method for a semiconductor device according to Embodiment 2 of the present invention.

A manufacturing method for a semiconductor device according to Embodiment 2 of the present invention and a semiconductor device gained in accordance with this manufacturing method are herein described. First, the steps up to the step shown in FIG. 18 are the same as those shown in FIGS. 1 to 6 described in Embodiment 1. In this step shown in FIG. 18, the film thickness of a thermal oxide film 9 is approximately 90 nm.

Figure 19:
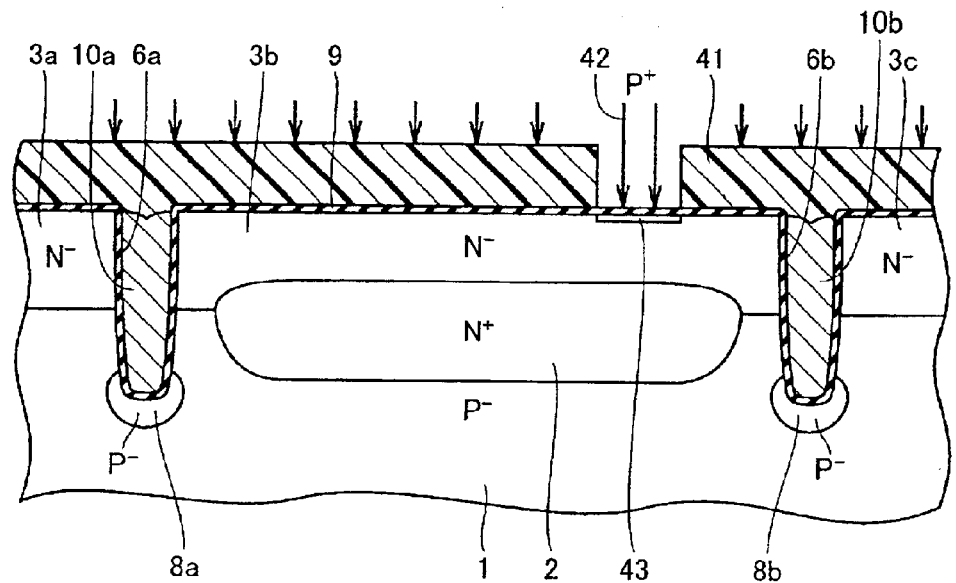
FIG. 19 is a cross sectional view showing a step that is carried out after the step shown in FIG. 18 according to Embodiment 2.
Figure 20:
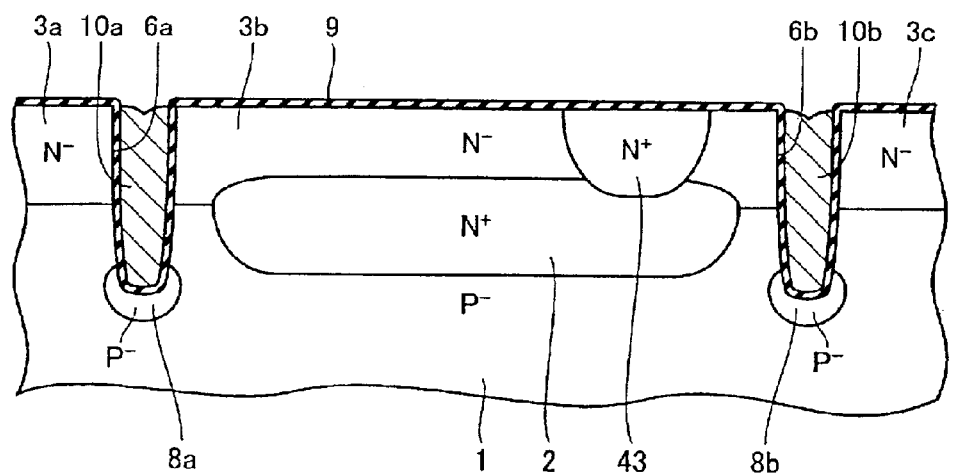
FIG. 20 is a cross sectional view showing a step that is carried out after the step shown in FIG. 19 according to Embodiment 2.

Next, as shown in FIG. 19, a photoresist 41 is formed on thermal oxide film 9. This photoresist 41 is used as a mask for introducing phosphorous ions 42 into a collector lead-out portion 43. A collector lead-out layer is formed by carrying out a thermal treatment in order to diffuse the phosphorous (phosphorous drive). Here, it is desirable to carry out this thermal treatment for the phosphorous drive under the condition wherein oxidation does not occur. Thereby, as shown in FIG. 20, a collector lead-out layer 43 is formed.

Figure 21:
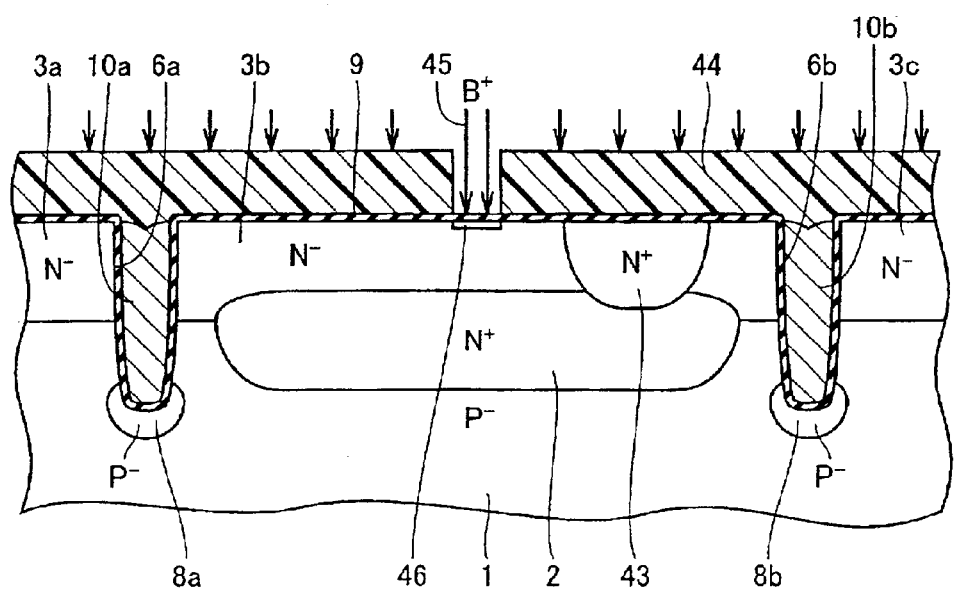
FIG. 21 is a cross sectional view showing a step that is carried out after the step shown in FIG. 20 according to Embodiment 2.
Figure 22:
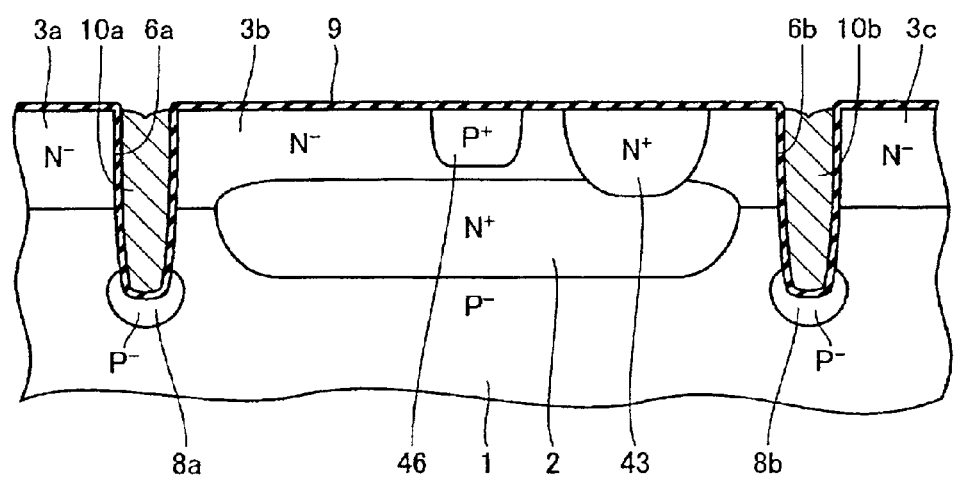
FIG. 22 is a cross sectional view showing a step that is carried out after the step shown in FIG. 21 according to Embodiment 2.

Next, as shown in FIG. 21, a photoresist 44 is formed on thermal oxide film 9. This photoresist 44 is used as a mask for introducing boron ions 45 into a base lead-out portion 46. Base lead-out layer 46 is formed, as shown in FIG. 22, by carrying out a thermal treatment in order to diffuse the boron (boron drive). Here, it is preferable to carry out the thermal treatment for the boron drive under the condition wherein oxidation does not occur.

Here, collector lead-out layer 43 and base lead-out layer 46 are formed by means of an ion implantation method because thermal oxide film 9 is comparatively thin and thermal oxide film 9 can not be utilized as a diffusion mask in a gas diffusion method.

Figure 23:
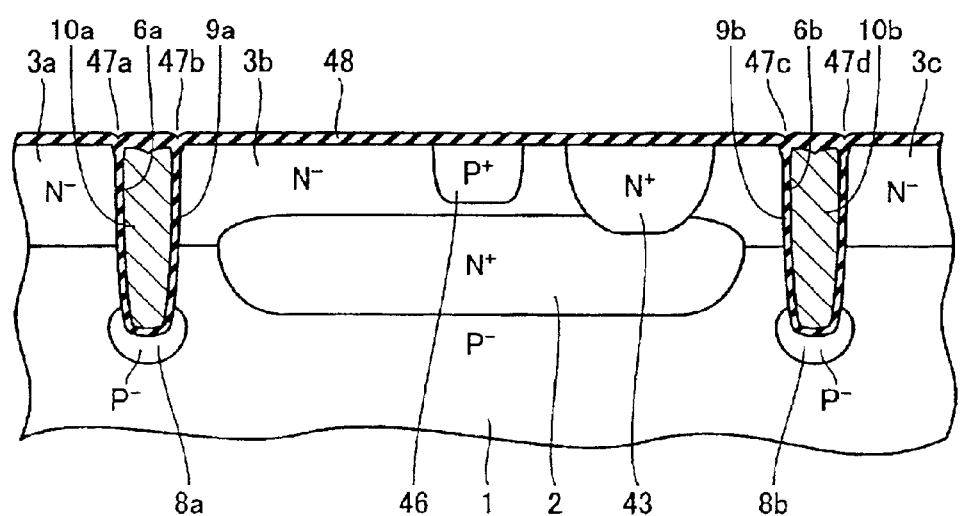
FIG. 23 is a cross sectional view showing a step that is carried out after the step shown in FIG. 22 according to Embodiment 2.

Next, as shown in FIG. 23, thermal oxide film 9 is made thicker by carrying out a thermal oxidation process and, thereby, a thermal oxide film 48 is formed. The thickness of this thermal oxide film 48 is approximately 0.1 μm. This step, shown in FIG. 23, corresponds to the step shown in FIG. 10 described in Embodiment 1.

Figure 24:
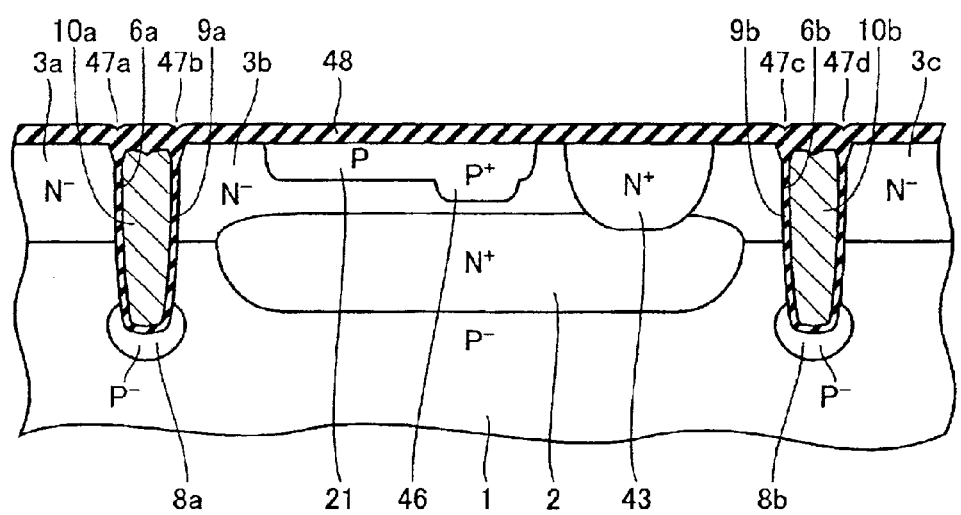
FIG. 24 is a cross sectional view showing a step that is carried out after the step shown in FIG. 23 according to Embodiment 2.
Figure 25:
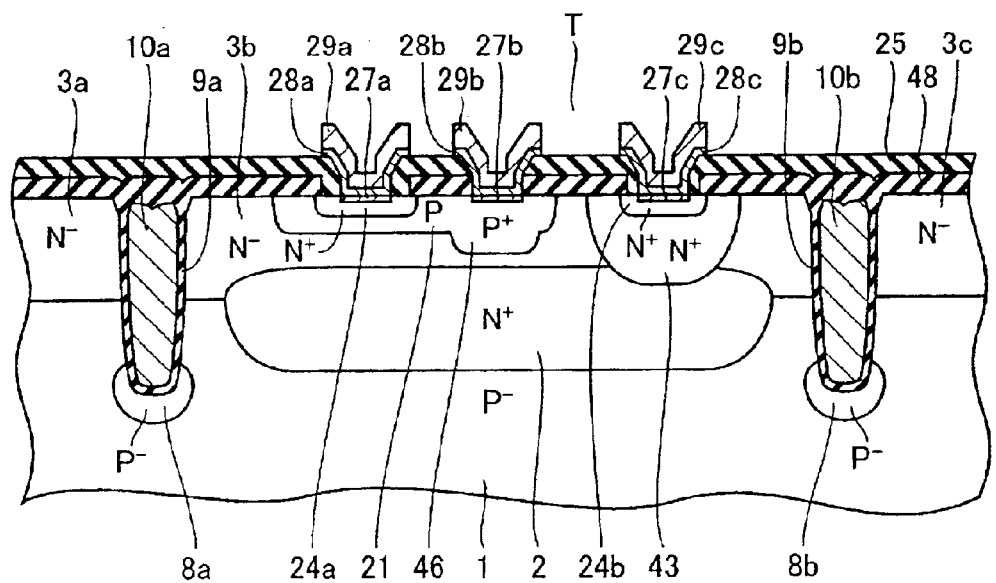
FIG. 25 is a cross sectional view showing a step that is carried out after the step shown in FIG. 24 according to Embodiment 2.

After that, the step shown in FIG. 11 and the step shown in FIG. 12 described in Embodiment 1 are carried out so as to gain the structure shown in FIG. 24. Furthermore, after that, the same steps as those from the step shown in FIG. 13 to the step shown in FIG. 15 described in Embodiment 1 are followed so as to complete an NPN transistor T, as shown in FIG. 25.

According to the above described manufacturing method for a semiconductor device, etching is not carried out at all on thermal oxide film 9 located on N⁻ type epitaxial layers 3a to 3c as described in Embodiment 1 and, thereby, the portions of thermal oxide film 9a and 9b located on the sidewalls in the vicinity of the edges of the openings of trenches 6a and 6b are prevented from becoming thicker at the time when thermal oxide film 31 is formed.

Furthermore, according to the above described manufacturing method, etching that corresponds to the etching of thermal oxide film 31, which is carried out between the step shown in FIG. 9 and the step shown in FIG. 10 described in Embodiment 1, is not carried out and, therefore, a further thermal oxidation process is carried out on thermal oxide film 48, in the step shown in FIG. 24, so that thermal oxide film 48 becomes thicker during formation.

Thereby, recesses 47a to 47d that occur in thermal oxide film 48 located in on the sidewalls in the vicinity of the edges of the openings of trenches 6a and 6b become smaller in comparison with the case of Embodiment 1 so that the film thickness of thermal oxide film 48 in these portions can be prevented from becoming greater.

As a result, as is described in Embodiment 1, the leak current between N⁻ type epitaxial layers 3a to 3c is reduced so that the elements, such as transistors, formed in each N⁻ type epitaxial layer 3a to 3c can be electrically isolated from each other without fail.

Embodiment 3

Figure 26:
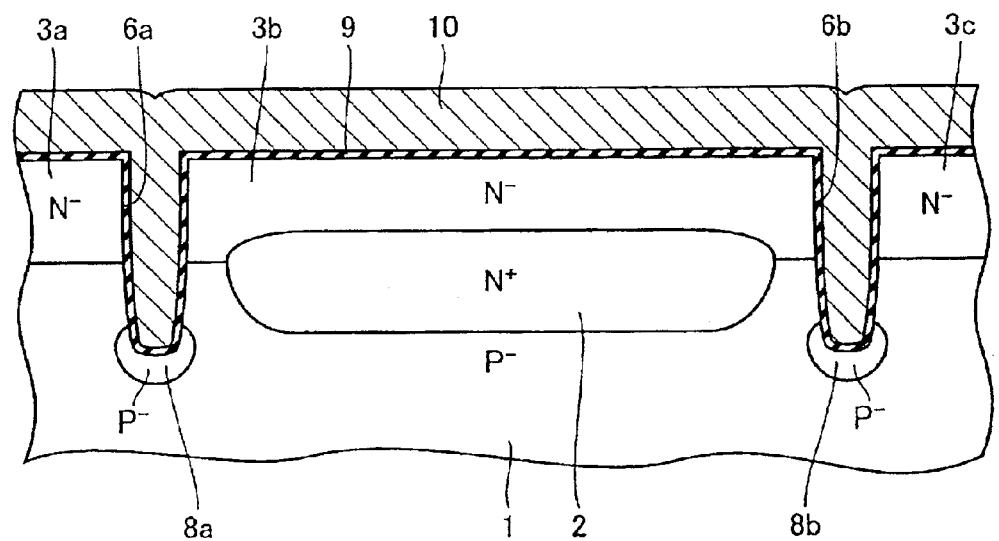
FIG. 26 is a cross sectional view showing one step of a manufacturing method for a semiconductor device according to Embodiment 3 of the present invention.

A manufacturing method for a semiconductor device according to Embodiment 3 of the present invention and a semiconductor device gained in accordance with this manufacturing method are herein described. First, the steps up to the step shown in FIG. 26 are the same as those shown in FIGS. 1 to 5 described in Embodiment 1.

Figure 27:
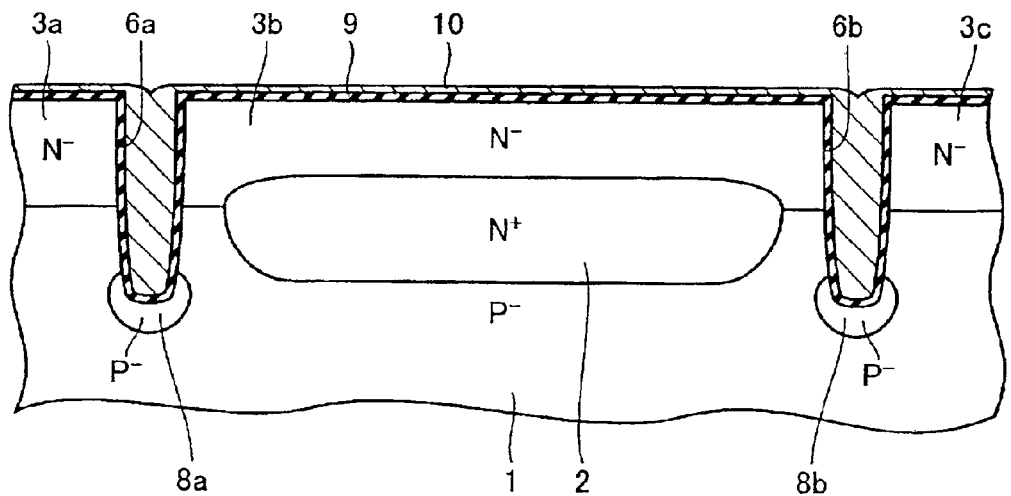
FIG. 27 is a cross sectional view showing a step that is carried out after the step shown in FIG. 26 according to Embodiment 3.
Figure 28:
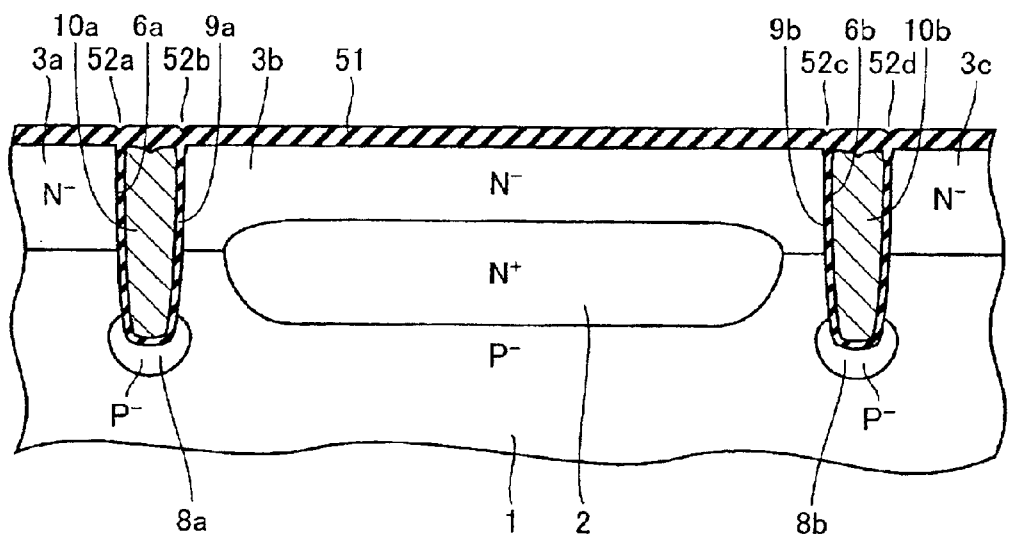
FIG. 28 is a cross sectional view showing a step that is carried out after the step shown in FIG. 27 according to Embodiment 3.

Next, as shown in FIG. 27, etching is carried out on the entire surface of a polysilicon film 10 to such a degree that a slight amount of polysilicon film 10 remains on thermal oxide film 9. The film thickness of remaining polysilicon film 10 at this time may be 50 nm, or less. Next, as shown in FIG. 28, a thermal oxide film 51 is formed by carrying out a thermal oxidation process under the condition wherein polysilicon film 10 remains. The thickness of thermal oxide film 51 is approximately 0.6 μm.

Here, as described in Embodiment 1, it is preferable that impurities are not added to buried polysilicon film 10a or 10b.

Figure 29:
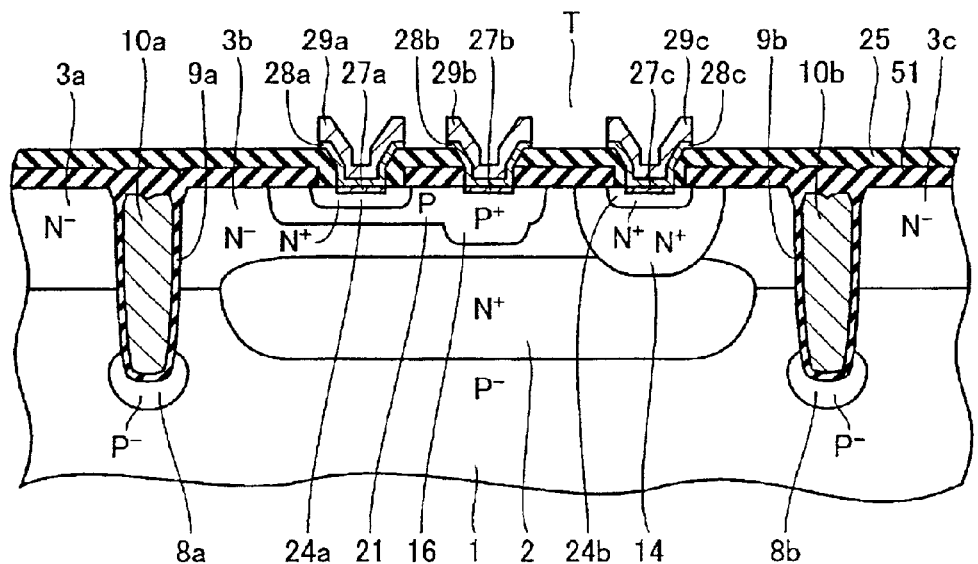
FIG. 29 is a cross sectional view showing a step that is carried out after the step shown in FIG. 28 according to Embodiment 3.

After that, the same steps as those from the step shown in FIG. 8 to the step shown in FIG. 15 described in Embodiment 1 are followed and, thereby, an NPN transistor T is completed, as shown in FIG. 29.

According to the above described manufacturing method for a semiconductor device, the etching of the entire surface of polysilicon film 10 in the step shown in FIG. 27 is carried out to such a degree that polysilicon film 10 remains on thermal oxide film 9. Then, a thermal oxidation process is carried out under the condition wherein such a polysilicon film 10 remains in the step shown in FIG. 28 and, thereby, a thermal oxide film 51 is formed. Thereby, recesses 52a to 52d that occur in thermal oxide film 51 become smaller.

Furthermore, predetermined etching is carried out on this thermal oxide film 51 to the required minimum amount in the same step as the step shown in FIG. 9 described in Embodiment 1 and, after that, a thermal oxidation process is carried out.

Thereby, recesses 13a to 13d that occur in the portions of thermal oxide film 51 located on the sidewalls in the vicinity of the edges of the openings of trenches 6a and 6b are prevented from becoming larger so that the film thickness of thermal oxide films 9a and 9b can be prevented from becoming greater in these portions.

As a result, the leak current between respective N⁻ type epitaxial layers 3a, 3b and 3c is extremely small so that the elements, such as transistors, formed in each of N⁻ type epitaxial layers 3a to 3c can be sufficiently electrically isolated.

Embodiment 4

Figure 30:
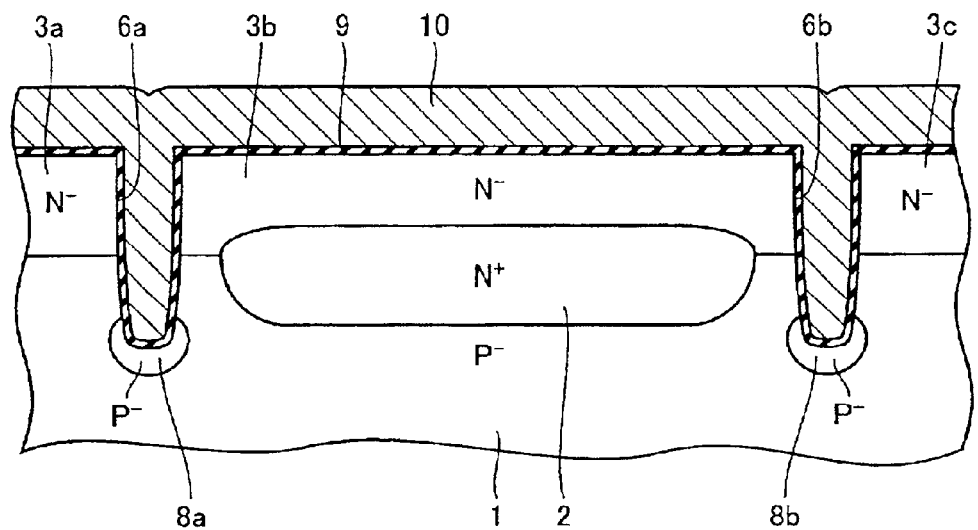
FIG. 30 is a cross sectional view showing one step of a manufacturing method for a semiconductor device according to Embodiment 4 of the present invention.

A manufacturing method for a semiconductor device according to Embodiment 4 of the present invention and a semiconductor device gained in accordance with this manufacturing method are herein described. First, the steps up to the step shown in FIG. 30 are the same as those shown in FIGS. 1 to 5 described in Embodiment 1.

Figure 31:
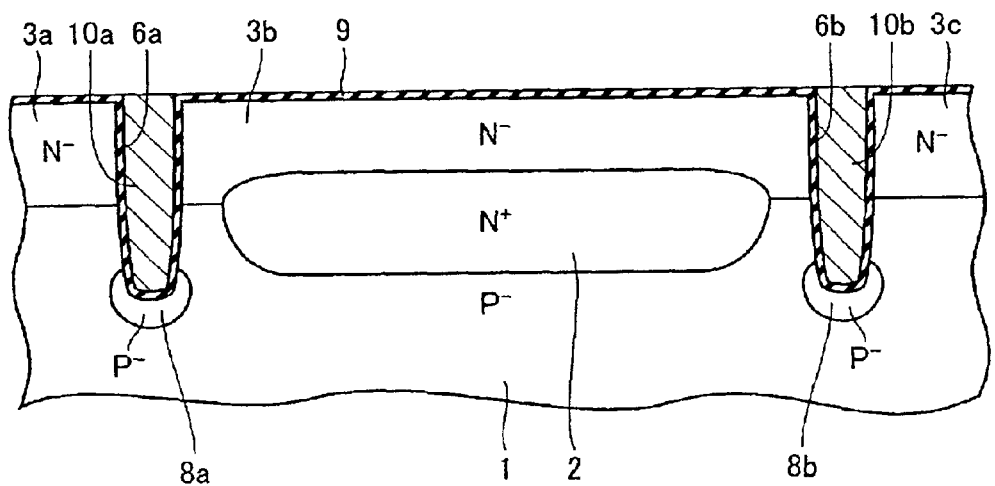
FIG. 31 is a cross sectional view showing a step that is carried out after the step shown in FIG. 30 according to Embodiment 4.
Figure 32:
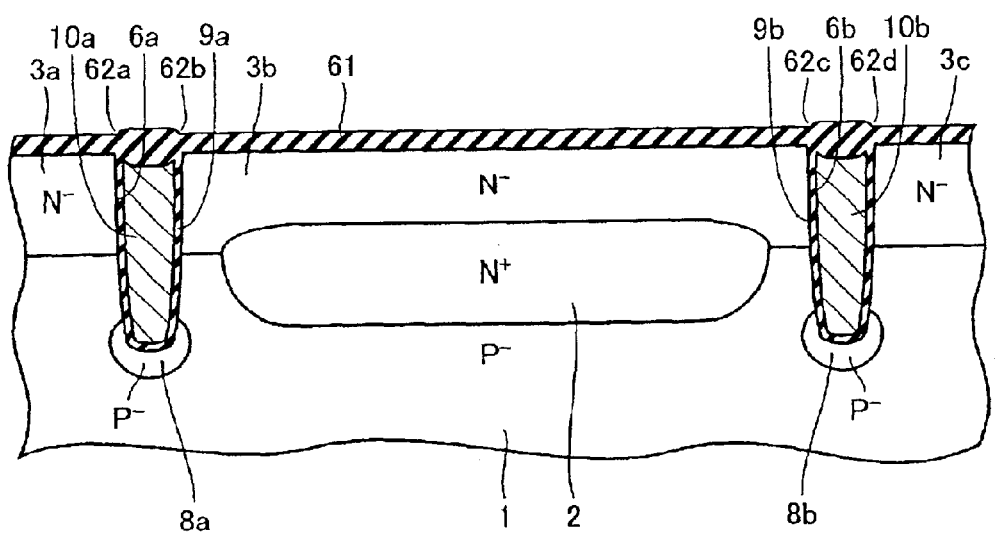
FIG. 32 is a cross sectional view showing a step that is carried out after the step shown in FIG. 31 according to Embodiment 4.

Next, as shown in FIG. 31, a CMP (chemical mechanical polishing) polishing process is carried out on polysilicon film 10. According to this CMP polishing process, the top surface of buried polysilicon films 10a and 10b and the surface of thermal oxide film 9 are positioned in approximately the same plane. Next, as shown in FIG. 32, a thermal oxide film 61, of which the film thickness is approximately 0.6 μm, is formed by carrying out a thermal oxidation process.

At this time, as described in Embodiment 1, etching is not carried out at all on thermal oxide film 9 located on N⁻ type epitaxial layers 3a to 3c and, thereby, the portions of the thermal oxide films 9a and 9b located on the sidewalls in the vicinity of the edges of the openings of trenches 6a and 6b are prevented from becoming thick at the time when thermal oxide film 31 is formed. Thereby, recesses 62a to 62d that occur in thermal oxide film 61 become comparatively small. Here, as described in Embodiment 1, it is preferable that impurities not be added to buried polysilicon film 10a or 10b.

Figure 33:
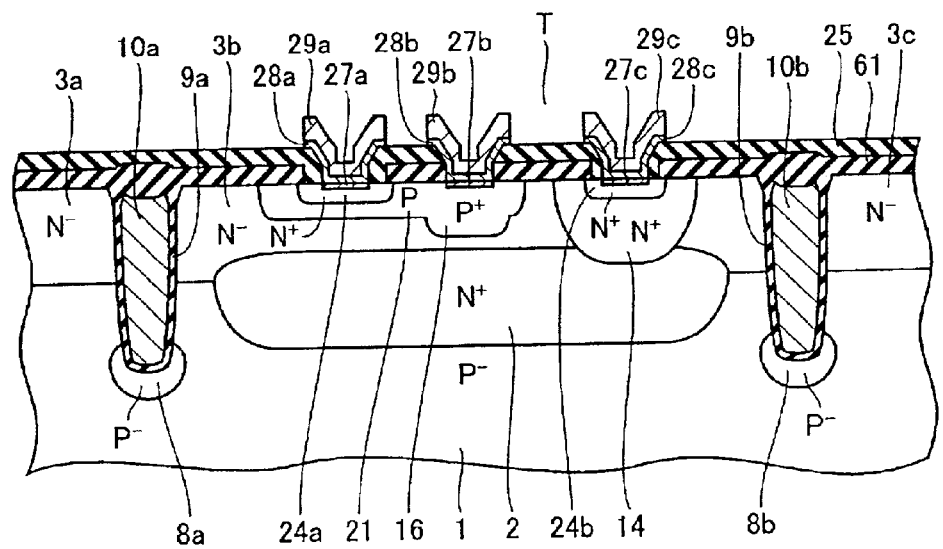
FIG. 33 is a cross sectional view showing a step that is carried out after the step shown in FIG. 32 according to Embodiment 4.

After that, the same steps as those from the step shown in FIG. 8 to the step shown in FIG. 15 described in Embodiment 1 are followed so as to complete an NPN transistor T, as shown in FIG. 33.

According to the above described manufacturing method for a semiconductor device, etching is not carried out at all on thermal oxide film 9 located on N⁻ type epitaxial layers 3a to 3c as described in Embodiment 1 and, thereby, the portions of thermal oxide films 9a and 9b located on the sidewalls in the vicinity of the edges of the openings of trenches 6a and 6b are prevented from becoming thick at the time when thermal oxide film 61 is formed.

Furthermore, predetermined etching is carried out on this thermal oxide film 61 to the required minimum amount in a step similar to the step shown in FIG. 9 described in Embodiment 1 and, after that, a thermal oxidation process is carried out.

Thereby, recesses 62a to 62d that occur in the portions of thermal oxide film 61 located on the sidewalls in the vicinity of the edges of the openings of trenches 6a and 6b are prevented from becoming large so that the film thickness of thermal oxide films 9a and 9b located on the sidewalls in the vicinity of the edges of the openings of trenches 6a and 6b can be prevented from becoming large.

As a result, the leak current between respective N⁻ type epitaxial layers 3a, 3b and 3c is extremely small so that the elements, such as transistors, formed in each N⁻ type epitaxial layer 3a to 3c can be sufficiently electrically isolated.

Furthermore, according to this manufacturing method, a CMP polishing process is carried out, in particular, on polysilicon film 10 so that the top surface of buried polysilicon films 10a and 10b and the surface of thermal oxide film 9 are located in approximately the same plane. Thereby, the flatness of the subsequently formed thermal oxide film or of the interlayer insulating film in the portions above trenches 6a and 6b is greatly increased so as to make it possible to carry out a microscopic process.

Embodiment 5

Figure 34:
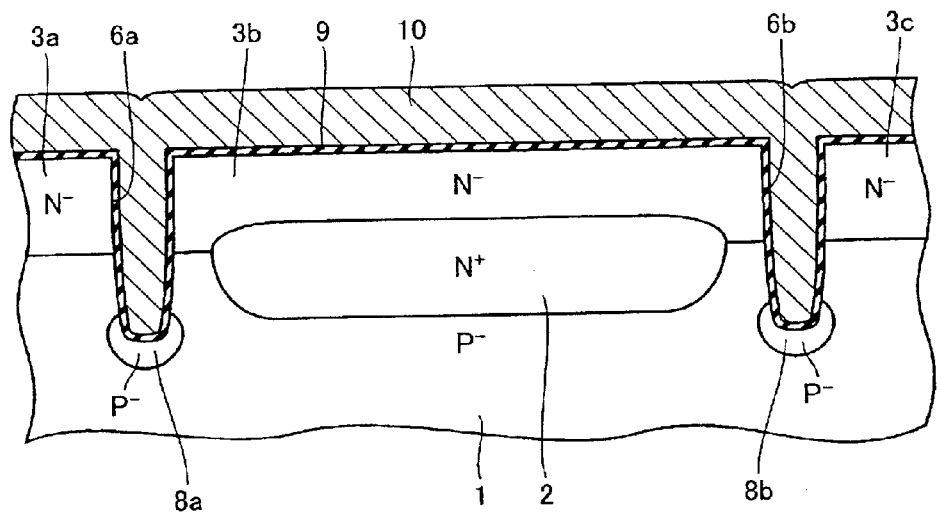
FIG. 34 is a cross sectional view showing one step of a manufacturing method for a semiconductor device according to Embodiment 5 of the present invention.

A manufacturing method for a semiconductor device according to Embodiment 5 of the present invention and a semiconductor device gained in accordance with this manufacturing method are herein described. First, the steps up to the step shown in FIG. 34 are the same as those shown in FIGS. 1 to 5 described in Embodiment 1.

Figure 35:
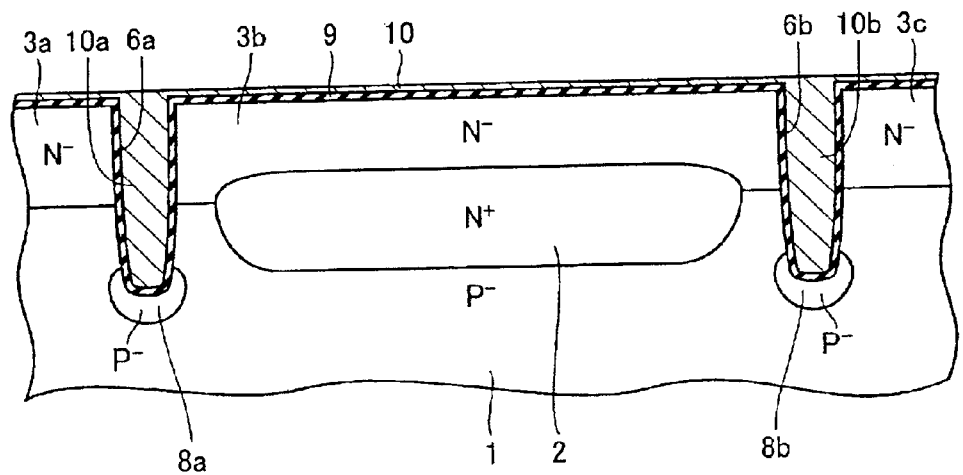
FIG. 35 is a cross sectional view showing a step that is carried out after the step shown in FIG. 34 according to Embodiment 5.

Next, as shown in FIG. 35, a CMP polishing process is carried out on polysilicon film 10. At this time, the CMP polishing process is carried out to such a degree that a thin polysilicon film 10 remains on thermal oxide film 9. It is preferable for the film thickness of this remaining polysilicon film 10 to be 50 nm, or less.

Figure 36:
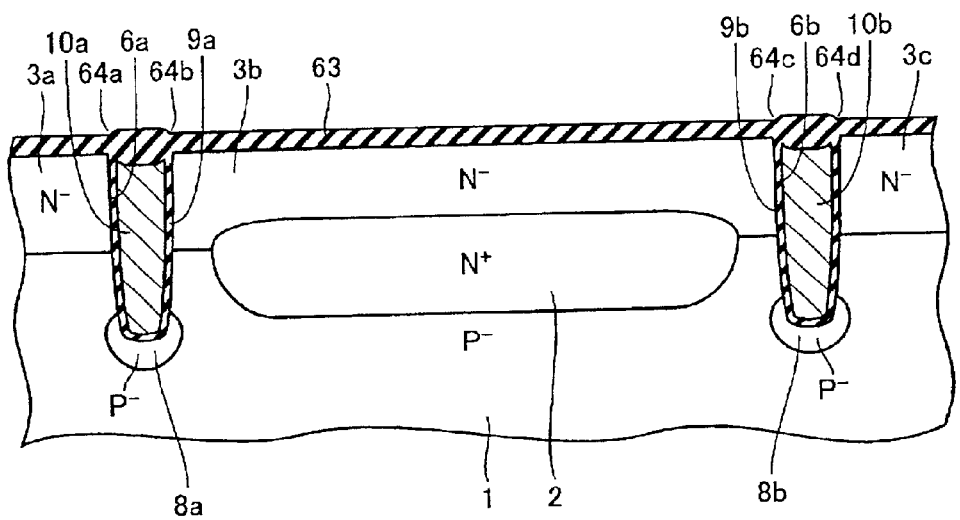
FIG. 36 is a cross sectional view showing a step that is carried out after the step shown in FIG. 35 according to Embodiment 5.
Figure 37:
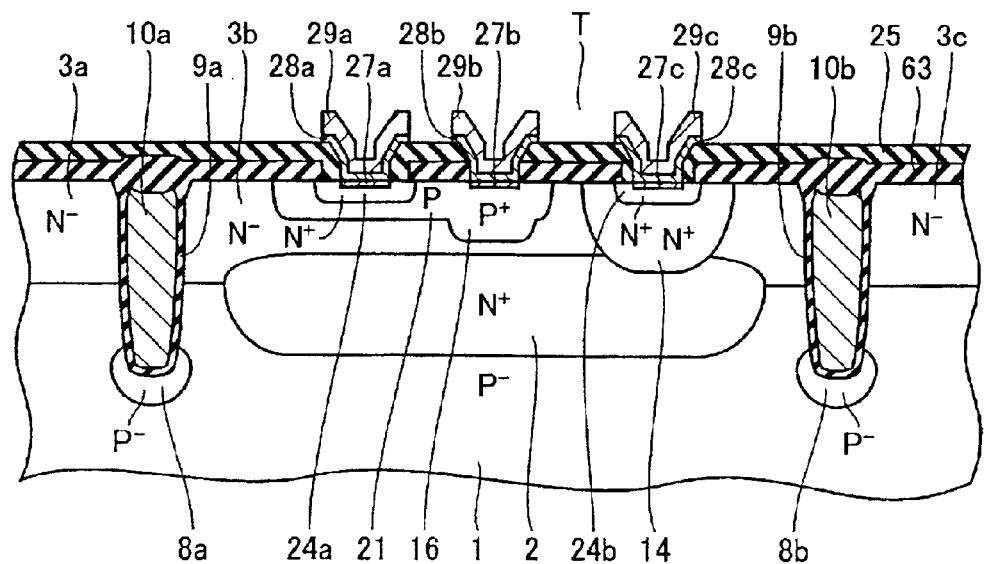
FIG. 37 is a cross sectional view showing a step that is carried out after the step shown in FIG. 36 according to Embodiment 5.

Next, as shown in FIG. 36, a thermal oxide film 63, of which the film thickness is approximately 0.6 µm, is formed by carrying out a thermal oxidation process under the condition wherein polysilicon film 10 remains on thermal oxide film 9. After that, the same steps as those from the step shown in FIG. 8 to the step shown in FIG. 15 described in Embodiment 1 are followed so as to complete an NPN transistor T, as shown in FIG. 37.

According to the above described manufacturing method for a semiconductor device, polishing is completed under the condition wherein polysilicon film 10 remains on thermal oxide film 9 in the step shown in FIG. 35 and, then, thermal oxide film 63 is formed through thermal oxidation. Thereby, the portions of thermal oxide films 9a and 9b located on the sidewalls in the vicinity of the edges of the openings of trenches 6a and 6b are prevented from becoming thick at the time of the formation of thermal oxide film 63.

Predetermined etching is carried out on this thermal oxide film 63 to the required minimum amount in a step similar to the step shown in FIG. 9 described in Embodiment 1 and, after that, a thermal oxidation process is carried out.

Thereby, recesses 64a to 64d that occur in the portions of thermal oxide film 61 located on the sidewalls in the vicinity of the edges of the openings of trenches 6a and 6b become comparatively small so that the film thickness of the portions of thermal oxide films 9a and 9b located on the sidewalls in the vicinity of the edges of the openings of trenches 6a and 6b can be prevented from becoming great.

As a result, the leak current between respective N⁻ type epitaxial layers 3a, 3b and 3c is extremely small so that the elements, such as transistors, formed in each N⁻ type epitaxial layer 3a to 3c can be sufficiently electrically isolated.

In addition, as described in Embodiment 4, a CMP polishing process is carried out on polysilicon film 10 so that the top surface of polysilicon film 10 is located in approximately the same plane. Thereby, flatness of the subsequently formed thermal oxide film or of the interlayer insulating film in the portions above trenches 6a and 6b is greatly increased so as to make it possible to carry out a microscopic process.

Embodiment 6

Figure 38:
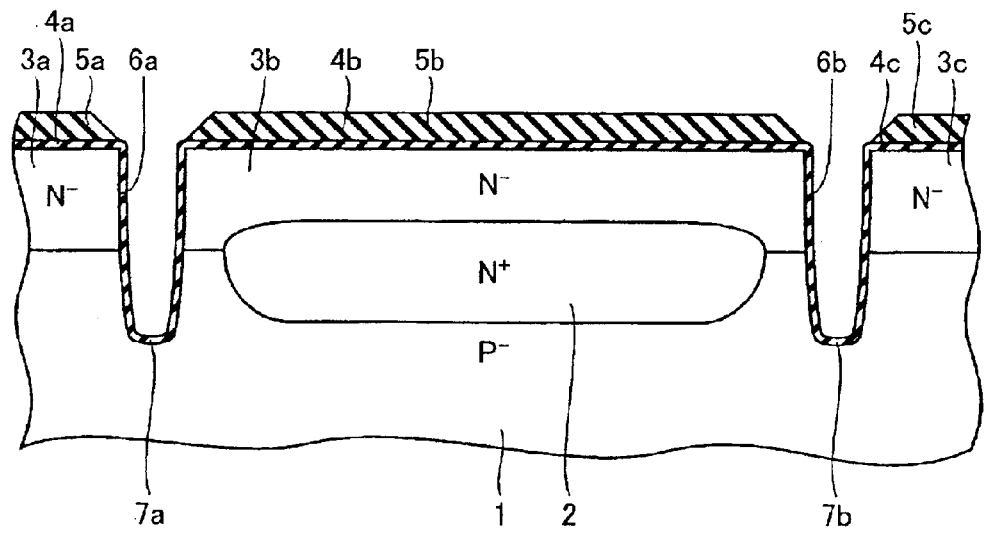
FIG. 38 is a cross sectional view showing one step of a manufacturing method for a semiconductor device according to Embodiment 6 of the present invention.

A manufacturing method for a semiconductor device according to Embodiment 6 of the present invention and a semiconductor device gained in accordance with this manufacturing method are herein described. First, the steps up to the step shown in FIG. 38 are the same as those from the step shown in FIG. 1 to the step shown in FIG. 3 described in Embodiment 1.

Figure 39:
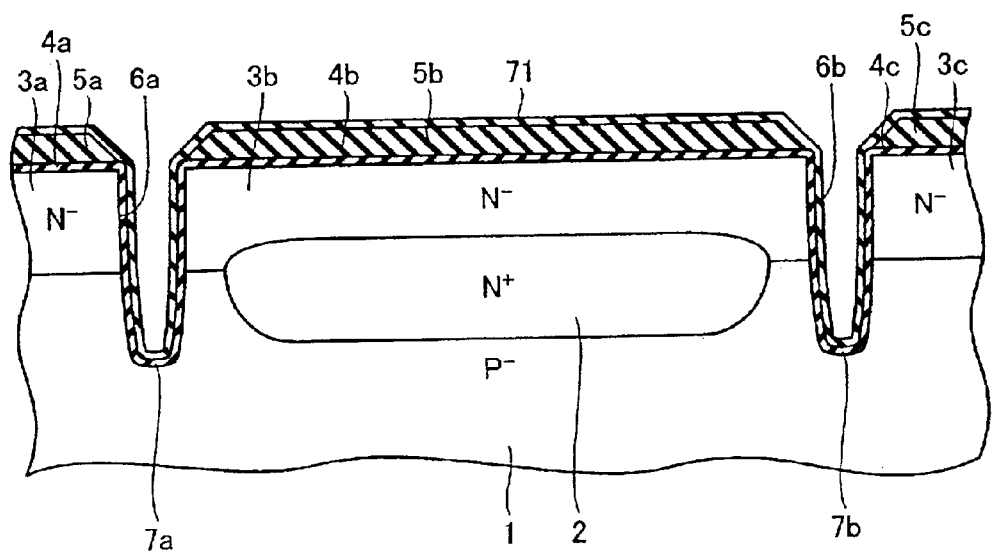
FIG. 39 is a cross sectional view showing a step that is carried out after the step shown in FIG. 38 according to Embodiment 6.

Next, as shown in FIG. 39, a silicon nitride film 71 is formed according to a CVD method. It is preferable for the film thickness of this silicon nitride film 71 to be approximately 50 nm, or less. This is because, in the case that the film thickness of silicon nitride film 71 becomes great, stress due to silicon nitride film 71 affects N⁻ type epitaxial layers 3a to 3c so that the leak current prevention effect is reduced.

Figure 40:
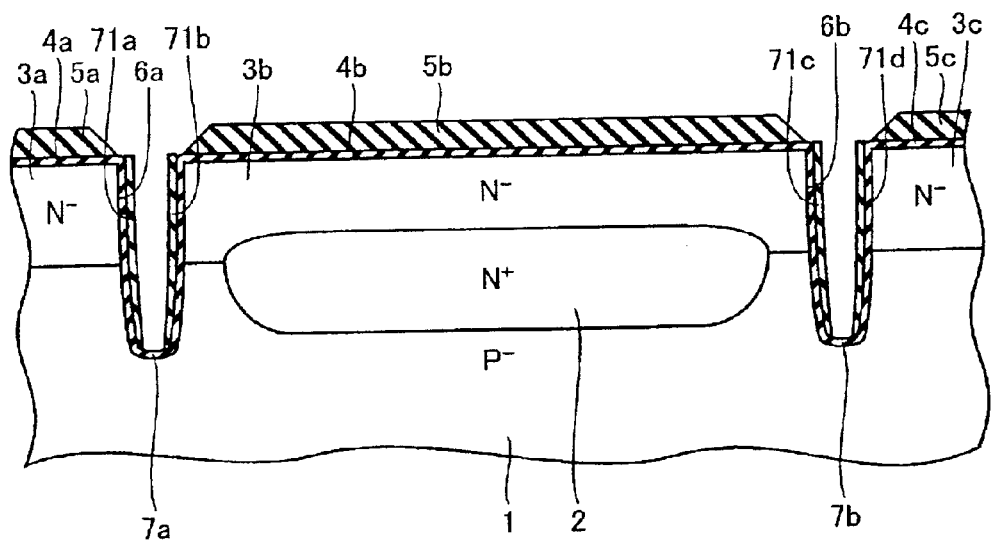
FIG. 40 is a cross sectional view showing a step that is carried out after the step shown in FIG. 39 according to Embodiment 6.

Next, as shown in FIG. 40, silicon nitride films 71a to 71d are made to remain only on the sidewalls of trenches 6a and 6b by carrying out etching on the entire surface of silicon nitride film 71 in accordance with reactive anisotropic etching (RIE).

Figure 41:
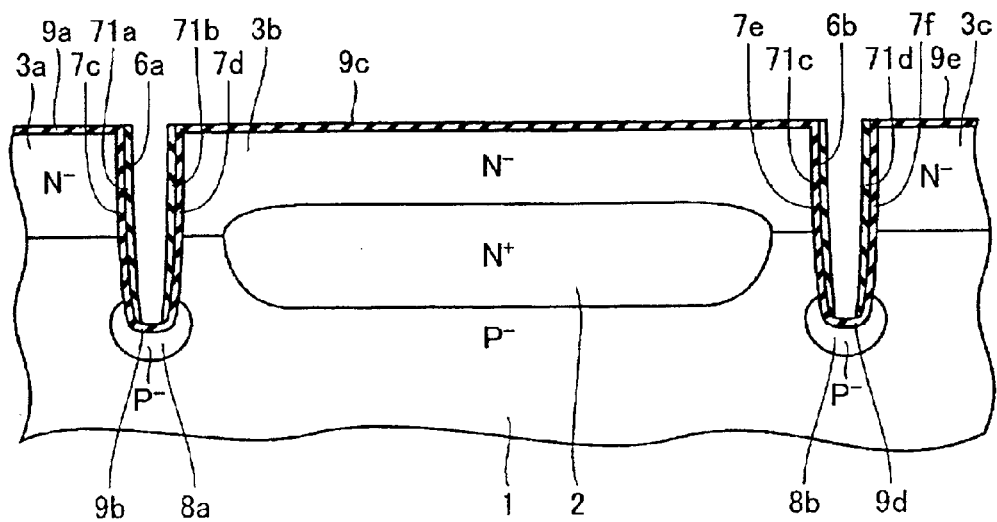
FIG. 41 is a cross sectional view showing a step that is carried out after the step shown in FIG. 40 according to Embodiment 6.

Next, thermal oxide films 5a to 5c and 4a to 4c are used as a mask so that boron is implanted into P⁻ type silicon substrate 1 through thermal oxide films 7a and 7b and, thereby, channel cut layers 8a and 8b are formed as shown in FIG. 41. After that, thermal oxide films 5a to 5c, 4a to 4c, 7a and 7b are removed through wet etching and thermal oxide films 9a to 9d, of which the film thickness is approximately 0.1 µm, are formed by carrying out a thermal oxidation process.

Figure 42:
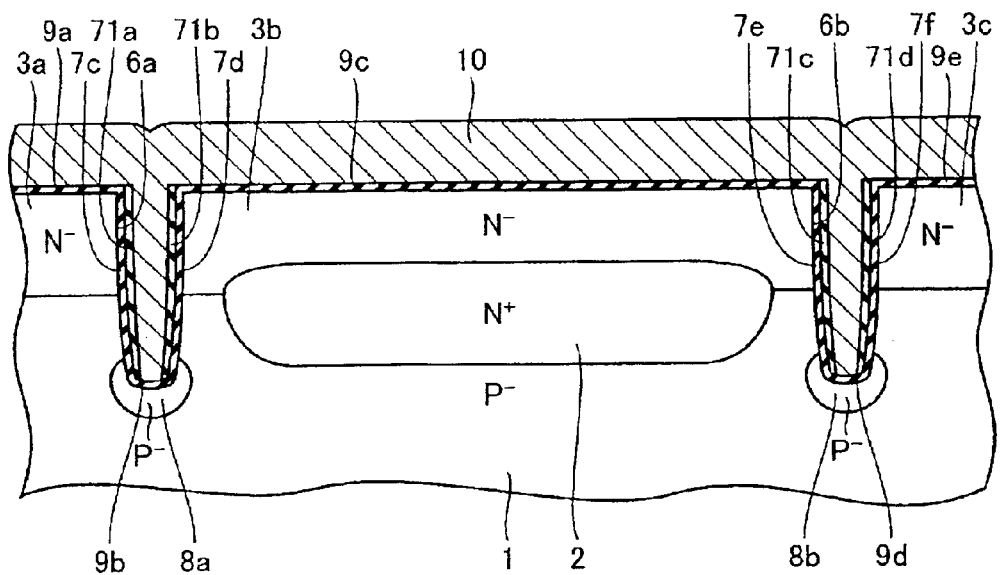
FIG. 42 is a cross sectional view showing a step that is carried out after the step shown in FIG. 41 according to Embodiment 6.
Figure 43:
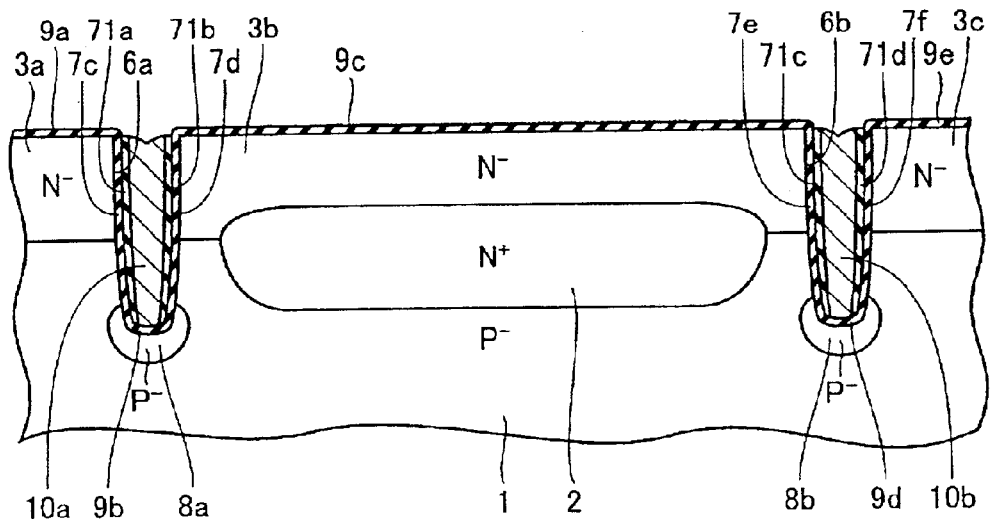
FIG. 43 is a cross sectional view showing a step that is carried out after the step shown in FIG. 42 according to Embodiment 6.

Next, as shown in FIG. 42, a polysilicon film 10, of which the film thickness is approximately 2 µm, is formed. Next, as shown in FIG. 43, etching is carried out on the entire surface of polysilicon film 10 and, thereby, buried polysilicon films 10a and 10b are formed so that the polysilicon films remain only within trenches 6a and 6b.

Figure 44:
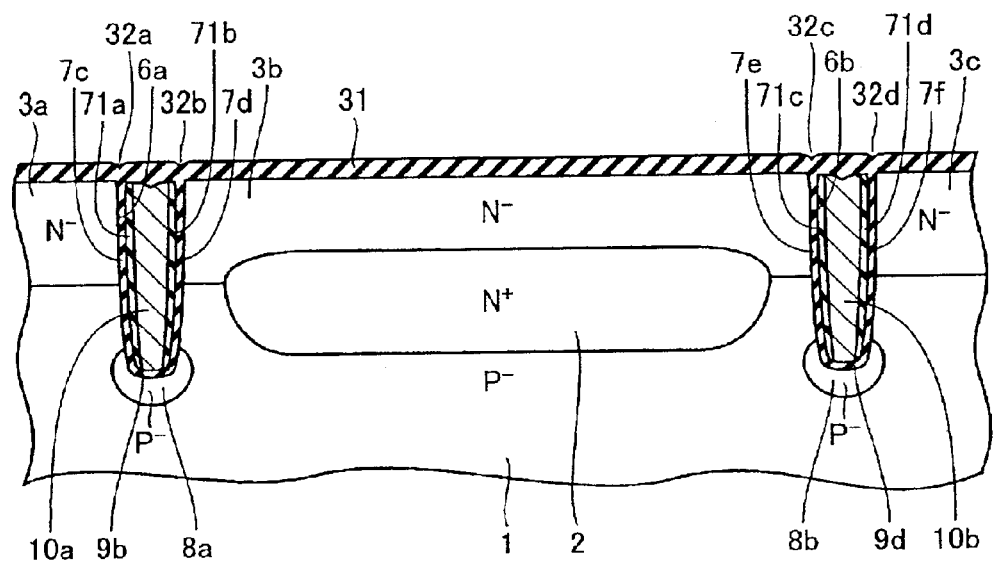
FIG. 44 is a cross sectional view showing a step that is carried out after the step shown in FIG. 43 according to Embodiment 6.

Next, as shown in FIG. 44, thermal oxide film 9 is made thicker by carrying out a thermal oxidation process so that a thermal oxide film 31, of which the film thickness is approximately 0.6 µm, is formed. This thermal oxide film 31 corresponds to thermal oxide film 112 according to the prior art.

Figure 45:
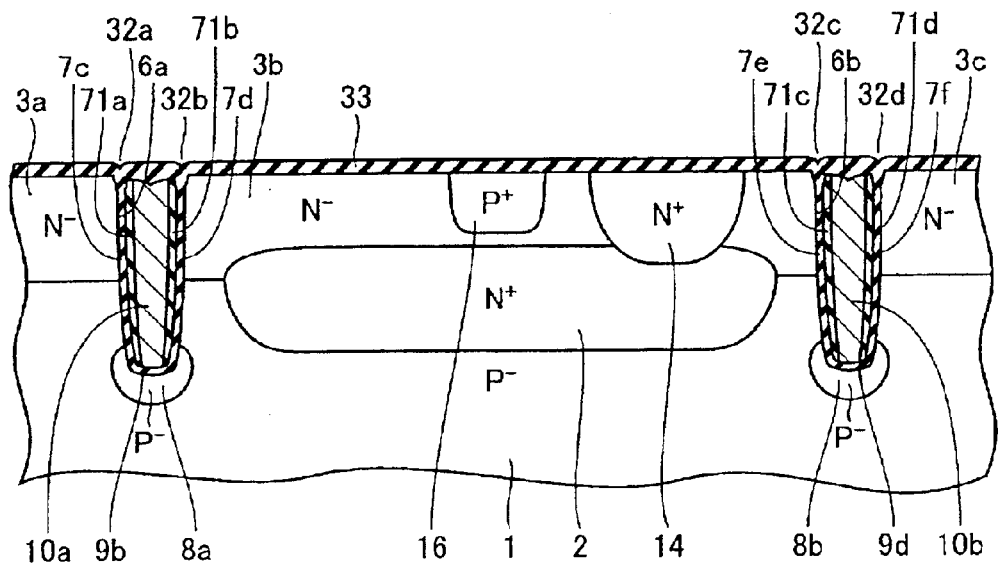
FIG. 45 is a cross sectional view showing a step that is carried out after the step shown in FIG. 44 according to Embodiment 6.

After that, the same steps as those from the step shown in FIG. 8 to the step shown in FIG. 10 described in Embodiment 1 are followed so as to gain the structure shown in FIG. 45. That is to say, after the formation of a collector lead-out layer 14 and a base lead-out layer 16 by means of a gas diffusion method, thermal oxide film 31 is removed through etching of the entire surface of the oxide film to the required minimum amount and, then, a thermal oxide film 33, of which the film thickness is approximately 0.1 µm, is formed in accordance with a thermal oxidation process.

Figure 46:
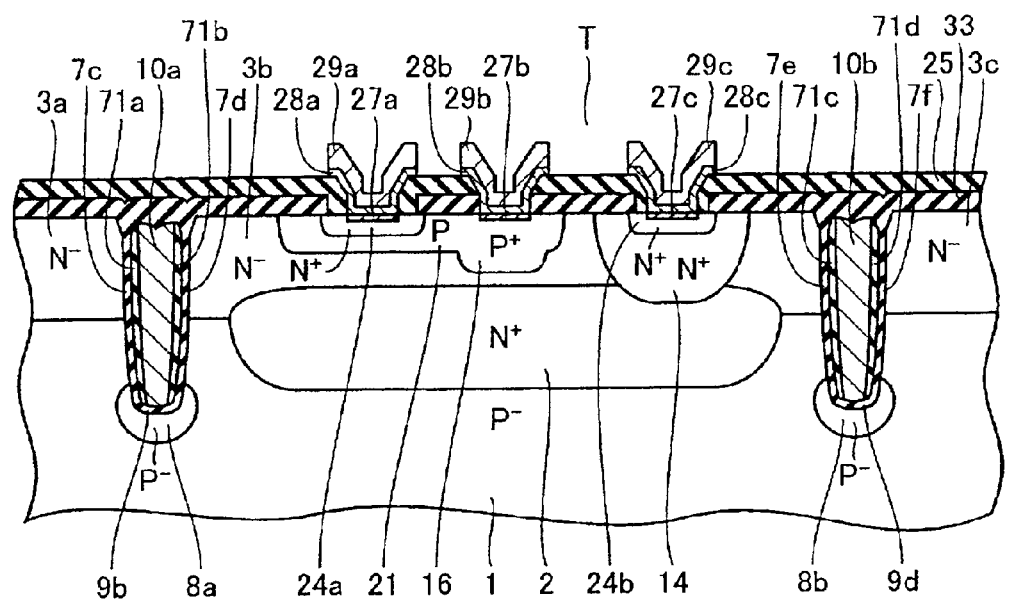
FIG. 46 is a cross sectional view showing a step that is carried out after the step shown in FIG. 45 according to Embodiment 6.

After that, the same steps as those from the step shown in FIG. 11 to the step shown in FIG. 15 described in Embodiment 1 are followed so as to complete an NPN transistor T, as shown in FIG. 46.

According to the above described manufacturing method for a semiconductor device, silicon nitride films 71a to 71d, which have the ability to prevent oxidation, are formed by allowing thermal oxide films 7a to 7d to intervene between the sidewalls of trenches 6a and 6b and the silicon nitride films. In addition, etching is not carried out at all on thermal oxide film 9 located on N⁻ type epitaxial layers 3a to 3c.

Thereby, in the step shown in FIG. 43, recesses 111a to 111d, as shown in FIG. 63, are prevented from being created along the sidewalls in the vicinity of edges of the openings of trench portions 6a and 6b. Then, silicon nitride films 71a to 71d are formed as oxidation prevention films between buried polysilicon films 10a, 10b and thermal oxide film 7 and, thereby, the portions of thick oxide films 7a and 7b located on the sidewalls in the vicinity of the edges of the openings of trenches 6a and 6b are, in particular, prevented from being oxidized during the thermal treatment at the time of the formation of thermal oxide film 31 so that the film thickness of these portions can be prevented without fail from becoming greater in comparison with the case of Embodiment 1.

As a result, the leak current between N⁻ type epitaxial layers 3a to 3c is further reduced so that the elements, such as transistors, formed in each N⁻ type epitaxial layer 3a to 3c can be electrically isolated from each other without fail.

Embodiment 7

Figure 47:
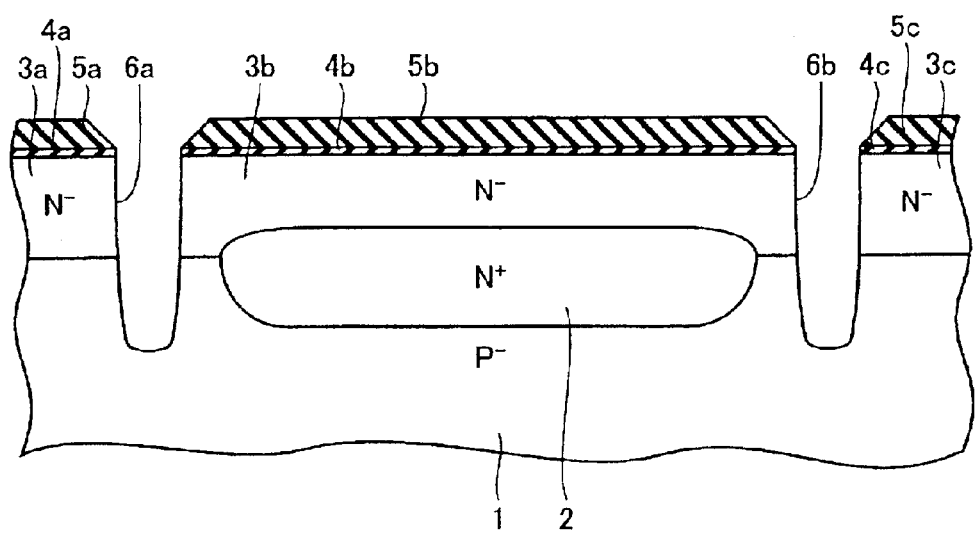
FIG. 47 is a cross sectional view showing one step of a manufacturing method for a semiconductor device according to Embodiment 7 of the present invention.

A manufacturing method for a semiconductor device according to Embodiment 7 of the present invention and a semiconductor device gained in accordance with this manufacturing method are herein described. First, the steps up to the step shown in FIG. 47 are the same as those from the step shown in FIG. 1 to the step shown in FIG. 2 described in Embodiment 1. After that, wet etching of oxide films or a cleaning process is carried out in order to remove reaction products that are produced at the time when trenches 6a and 6b are created.

Figure 48:
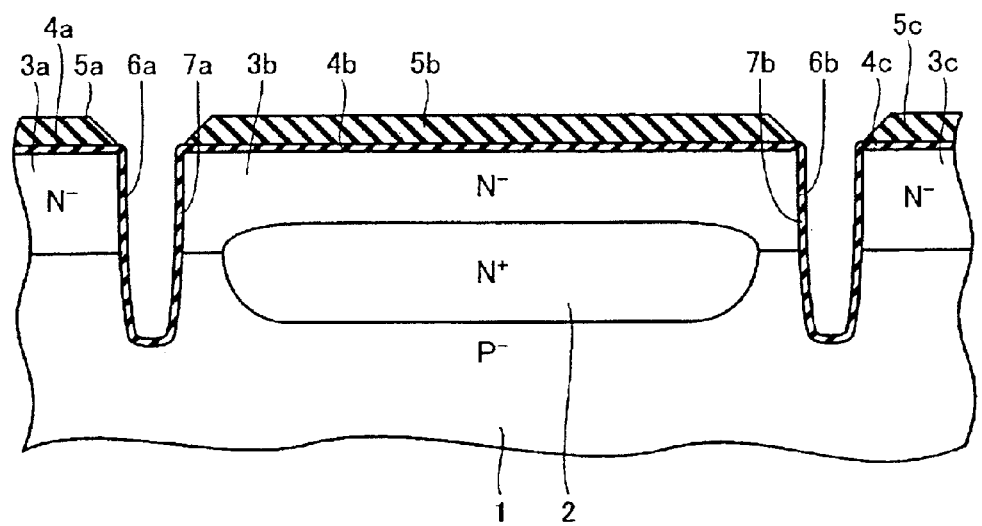
FIG. 48 is a cross sectional view showing a step that is carried out after the step shown in FIG. 47 according to Embodiment 7.
Figure 49:
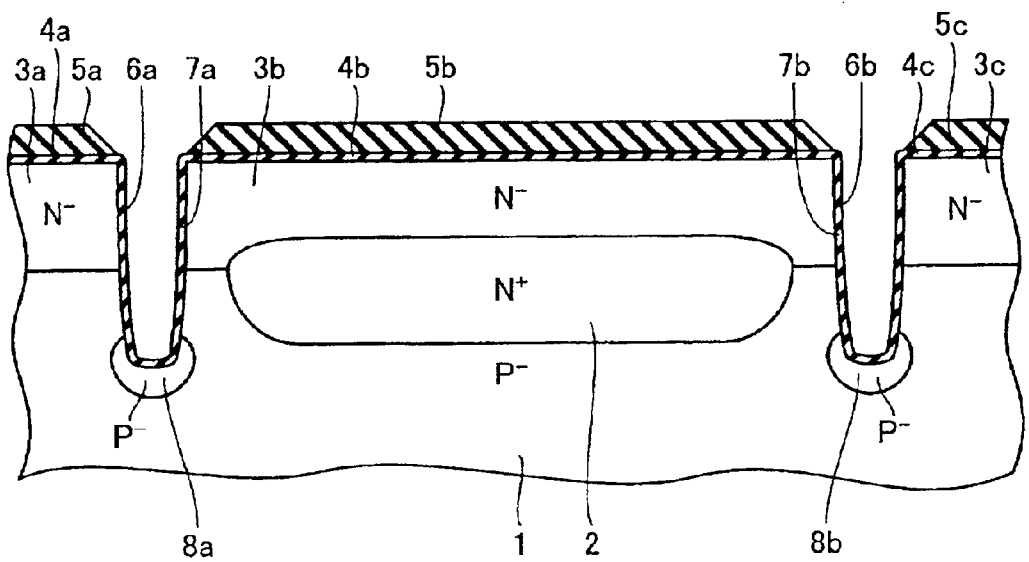
FIG. 49 is a cross sectional view showing a step that is carried out after the step shown in FIG. 48 according to Embodiment 7.

After that, as shown in FIG. 48, a thermal oxidation process is carried out and, thereby, sacrificial oxide films 7a and 7b, of which the film thickness is approximately 50 nm, are formed on the sidewalls of trenches 6a and 6b, and the like. Next, as shown in FIG. 49, silicon oxide films 5a to 5c and 4a to 4c are used as a mask so that boron is implanted through thermal oxide films 7a and 7b and, thereby, channel cut layers 8a and 8b are formed in the portions of P type silicon substrate 1.

Figure 50:
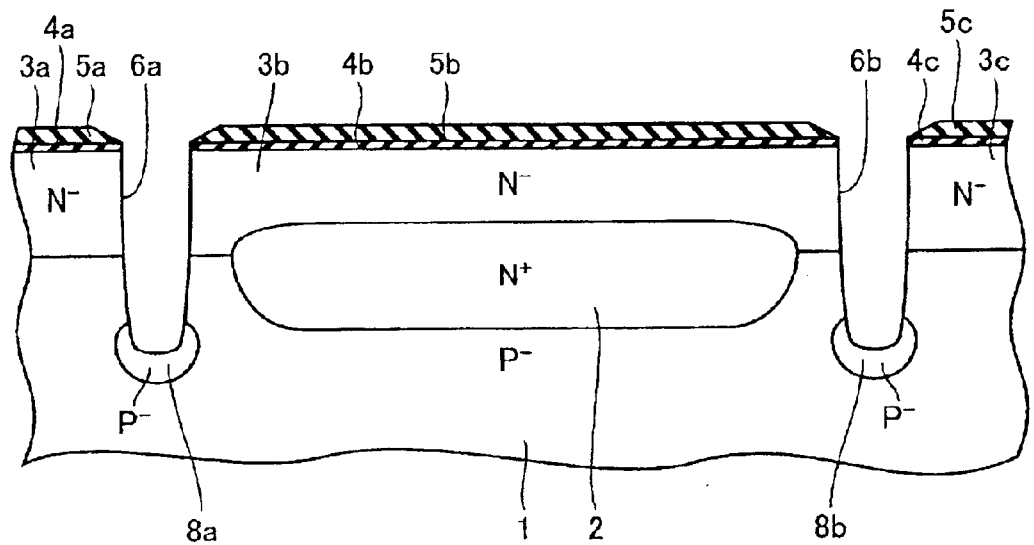
FIG. 50 is a cross sectional view showing a step that is carried out after the step shown in FIG. 49 according to Embodiment 7.
Figure 51:
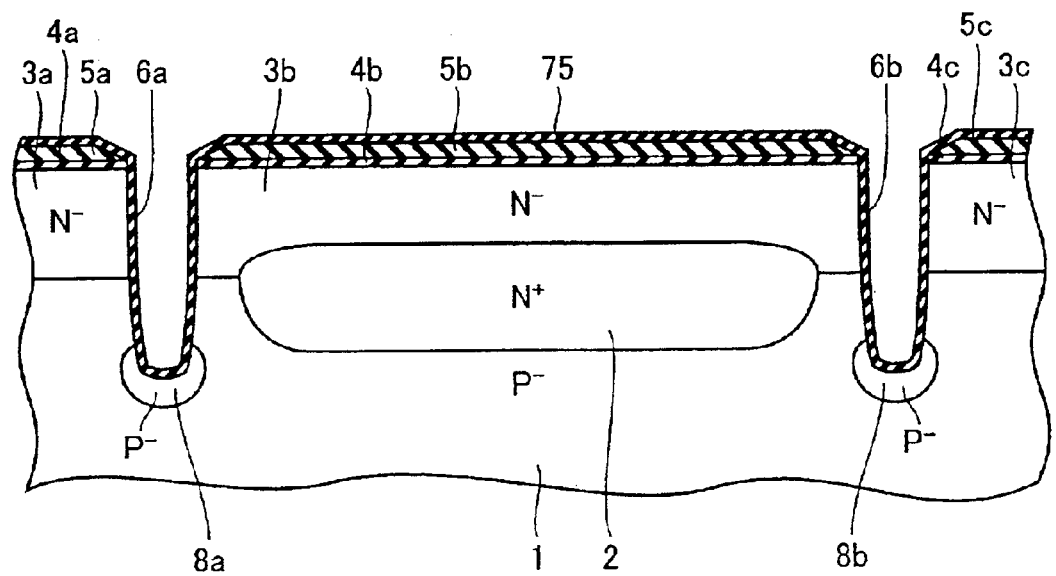
FIG. 51 is a cross sectional view showing a step that is carried out after the step shown in FIG. 50 according to Embodiment 7.

Next, as shown in FIG. 50, sacrificial oxide films 7a and 7b are removed by carrying out etching. At this time, since the etching is carried out on silicon oxide films 5a to 5c, the film thickness thereof becomes thinner. Next, as shown in FIG. 51, a silicon nitride film 75 is formed by means of a CVD method. It is preferable for the film thickness of silicon nitride film 75 to be approximately 50 nm, or less, when taking into consideration the stress of the silicon nitride film itself.

Figure 52:
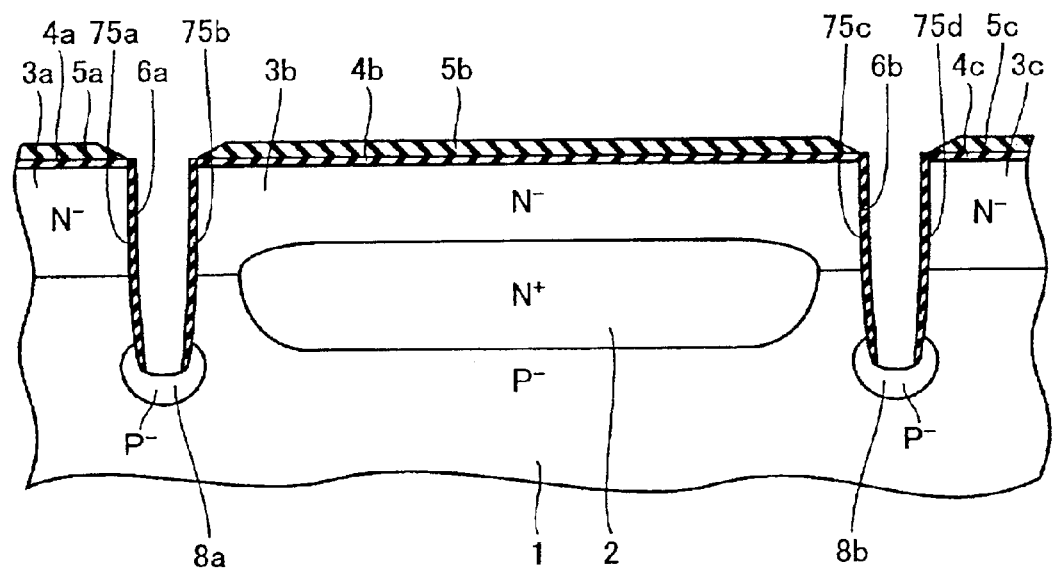
FIG. 52 is a cross sectional view showing a step that is carried out after the step shown in FIG. 51 according to Embodiment 7.
Figure 53:
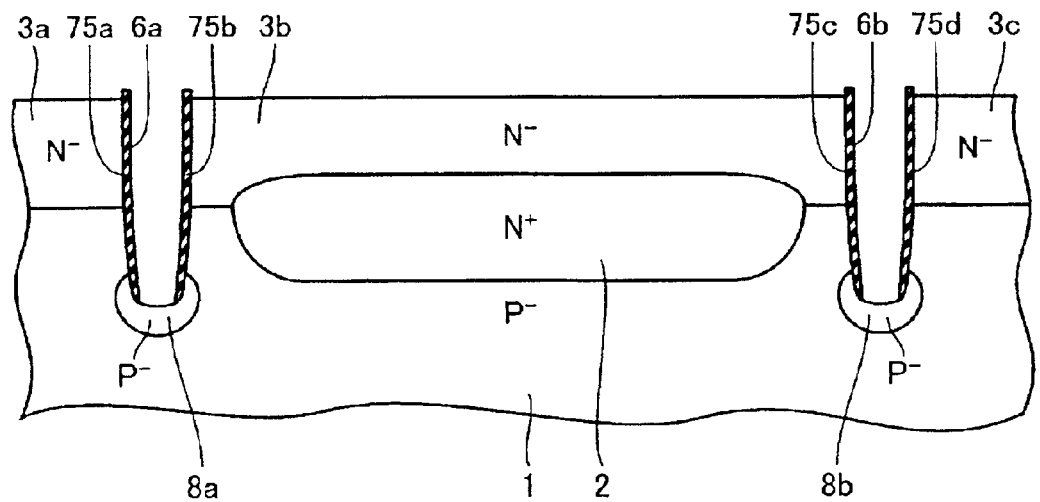
FIG. 53 is a cross sectional view showing a step that is carried out after the step shown in FIG. 52 according to Embodiment 7.

Next, as shown in FIG. 52, anisotropic etching is carried out on silicon nitride film 75 so that silicon nitride films 75a to 75d, respectively, remain only on the sidewalls of trenches 6a and 6b. Next, as shown in FIG. 53, silicon oxide films 5a to 5c and 4a to 4c are removed by carrying out wet etching.

Figure 54:
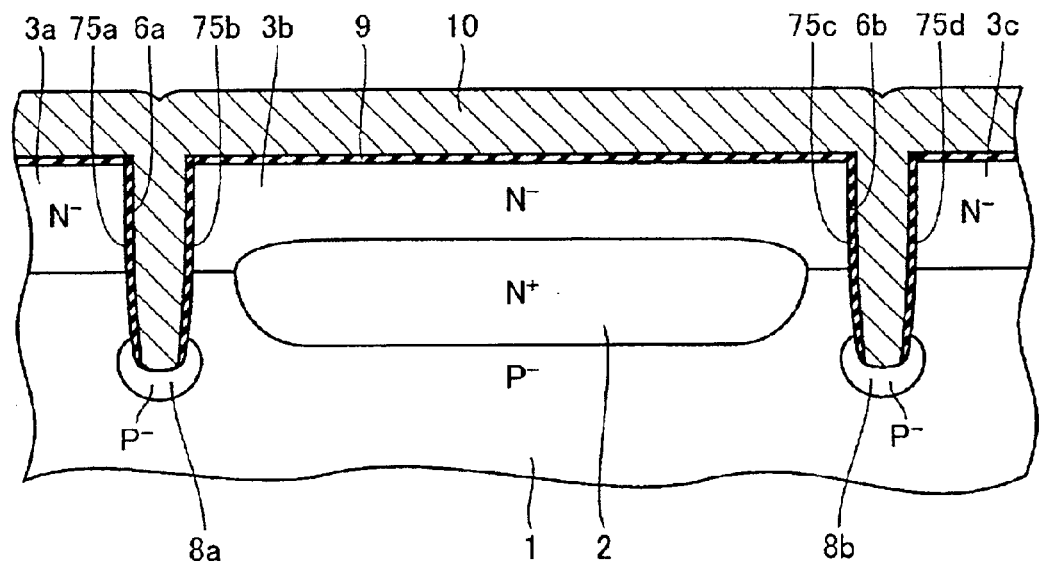
FIG. 54 is a cross sectional view showing a step that is carried out after the step shown in FIG. 53 according to Embodiment 7.

Next, as shown in FIG. 54, a thermal oxide film 9, of which the film thickness is approximately 0.1 μm, is formed by carrying out a thermal oxidation process. After that, portions of thermal oxide film 9 located at the bottoms of trenches 6a and 6b are removed so as to expose portions of P⁻ type silicon substrate 1. Next, a polysilicon film 10, of which the film thickness is approximately 2 μm, is formed on thermal oxide film 9.

At this time, polysilicon film 10 and the portions of P⁻ type silicon substrate 1 contact each other at the bottoms of trenches 6a and 6b. In particular, in polysilicon film 10 in this embodiment, it is desirable for boron, for example, to be added so as to make an electrical connection with the portions of P⁻ type silicon substrate 1.

Figure 55:
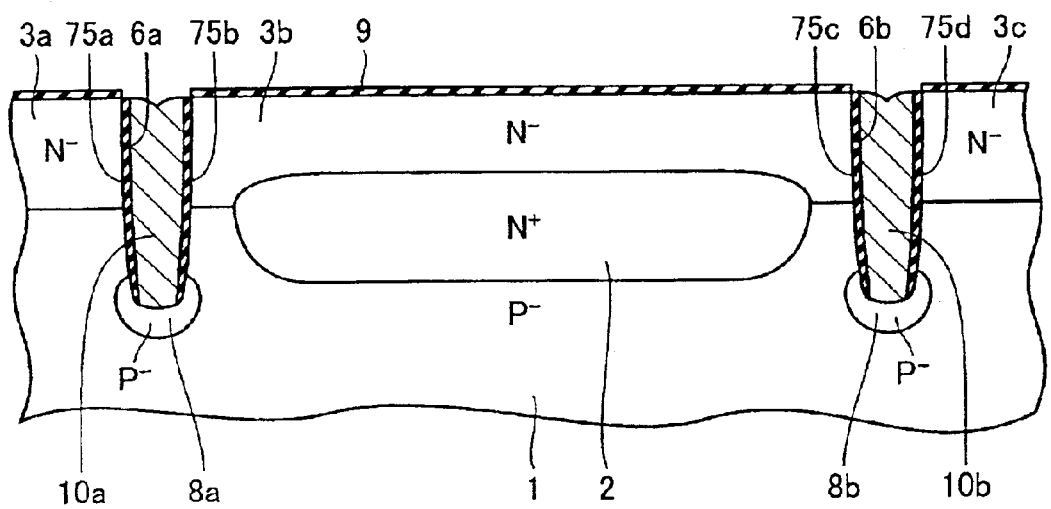
FIG. 55 is a cross sectional view showing a step that is carried out after the step shown in FIG. 54 according to Embodiment 7.

Next, as shown in FIG. 55, etching is carried out on the entire surface of polysilicon film 10 and, thereby, buried polysilicon films 10a and 10b are formed so that the polysilicon films remain only within trenches 6a and 6b. At this time, etching is carried out on polysilicon film 10 under the conditions wherein etching rates of silicon nitride films 75a to 75d and of polysilicon film 10 become substantially the same etching rate and, thereby, the top surface of buried polysilicon films 10a and 10b and the top surface of silicon nitride films 75a to 75d are located in approximately the same plane.

Figure 56:
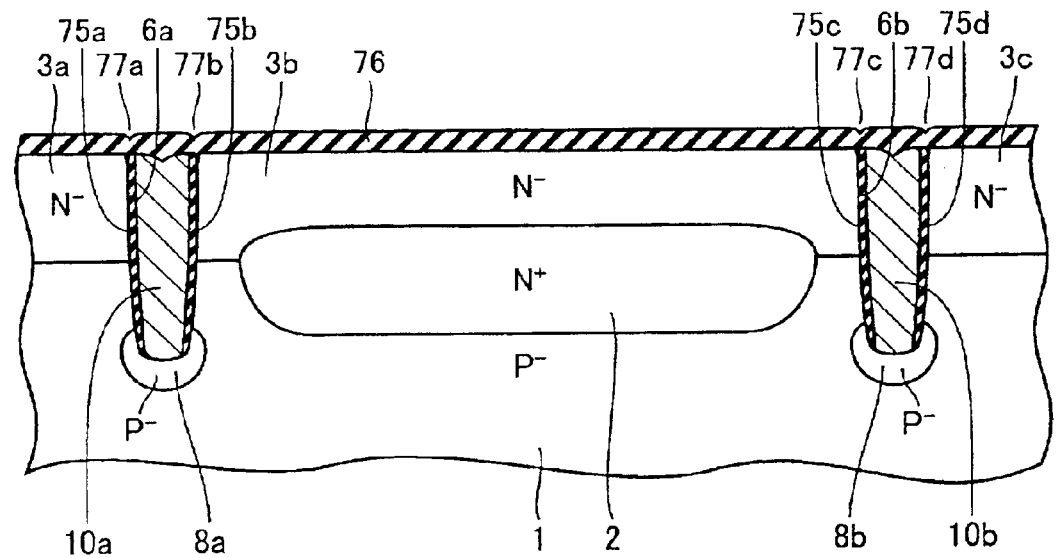
FIG. 56 is a cross sectional view showing a step that is carried out after the step shown in FIG. 55 according to Embodiment 7.

Next, as shown in FIG. 56, the film thickness of thermal oxide film 9 is increased by carrying out a thermal oxidation process so as to form a thermal oxide film 76, of which the film thickness is approximately 0.6 μm. This thermal oxide film 76 corresponds to thermal oxide film 112 according to the conventional manufacturing method.

Figure 57:
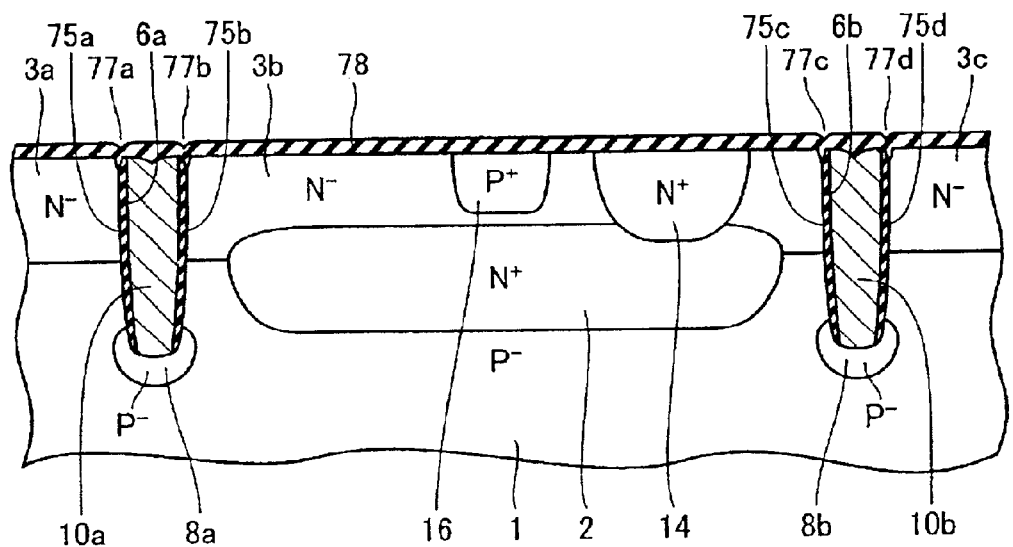
FIG. 57 is a cross sectional view showing a step that is carried out after the step shown in FIG. 56 according to Embodiment 7.

After that, the same steps as those from the step shown in FIG. 8 to the step shown in FIG. 10 described Embodiment 1 are followed so as to gain the structure shown in FIG. 57. That is to say, after the formation of a collector lead-out layer 14 and of a base lead-out layer 16 by means of a gas diffusion method, thermal oxide film 76 is removed through etching of the entire surface of the oxide film to the required minimum amount and, then, a thermal oxide film 78, of which the film thickness is approximately 0.1 μm, is formed according to a thermal oxidation process.

Figure 58:
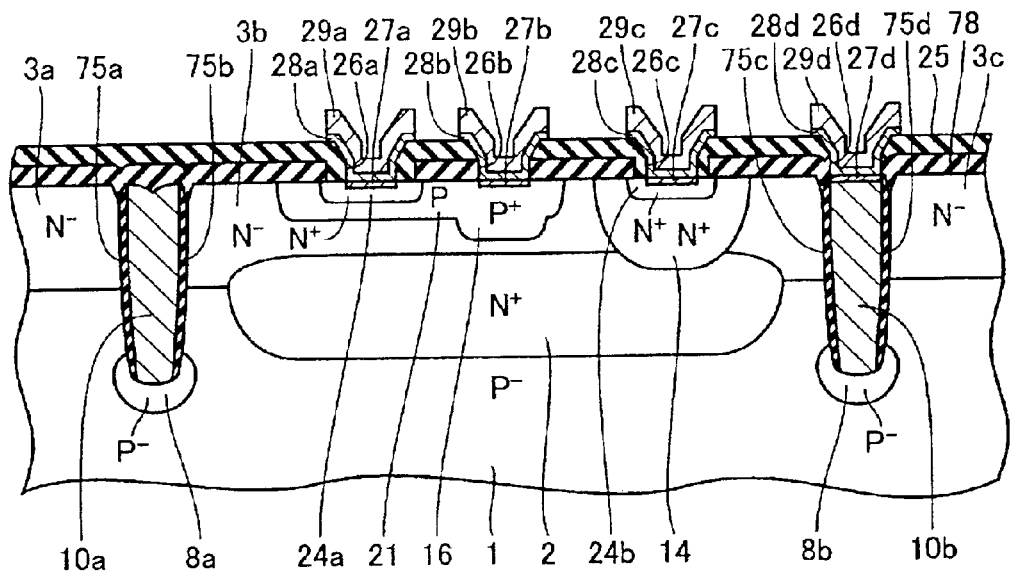
FIG. 58 is a cross sectional view showing a step that is carried out after the step shown in FIG. 57 according to Embodiment 7.

After that, the same steps as those from the step shown in FIG. 11 to the step shown in FIG. 15 described Embodiment 1 are followed so as to complete an NPN transistor T, as shown in FIG. 58. In particular, an isolation contact 26d that is electrically connected P⁻ type silicon substrate 1 is formed in this semiconductor device.

According to the above described manufacturing method for a semiconductor device, the sidewalls of trenches 6a and 6b are, respectively, covered with silicon nitride films 75a to 75d that have the ability to prevent oxidation. In addition, etching is not carried out at all on thermal oxide film 9 located on N⁻ type epitaxial layers 3a to 3c.

Thereby, in the step shown in FIG. 55, recesses 111a to 111d, as shown in FIG. 63, are not created along the sidewalls in the vicinity of the edges of the openings of trench portions 6a and 6b. Then, silicon nitride films 75a to 75b are formed as oxidation prevention films between buried polysilicon films 10a, 10b and thermal oxide film 7 and, thereby, the portions of thermal oxide films 7a and 7b located along the sidewalls in the vicinity of the edges of the openings of trench portions 6a and 6b are prevented from being oxidized, in particular, during a thermal treatment at the time of the formation of thermal oxide film 76 so that the film thickness of these portions can be prevented without fail from becoming greater in comparison with the case in Embodiment 1.

As a result, the leak current between N⁻ type epitaxial layers 3a to 3c is further reduced so that the elements, such as transistors, formed in each N⁻ type epitaxial layer 3a to 3c can be electrically isolated from each other without fail.

Furthermore, in a semiconductor device gained according to this manufacturing method, buried polysilicon film 10b formed in trench 6b is electrically connected to the portion of P type silicon substrate 1 at the bottom of trench 6b.

Thereby, the potential of isolation contact 26d becomes the same as the potential of P⁻ type silicon substrate 1 so that the potential P⁻ type silicon substrate 1 can be secured via isolation contact 26d.

Figure 59:
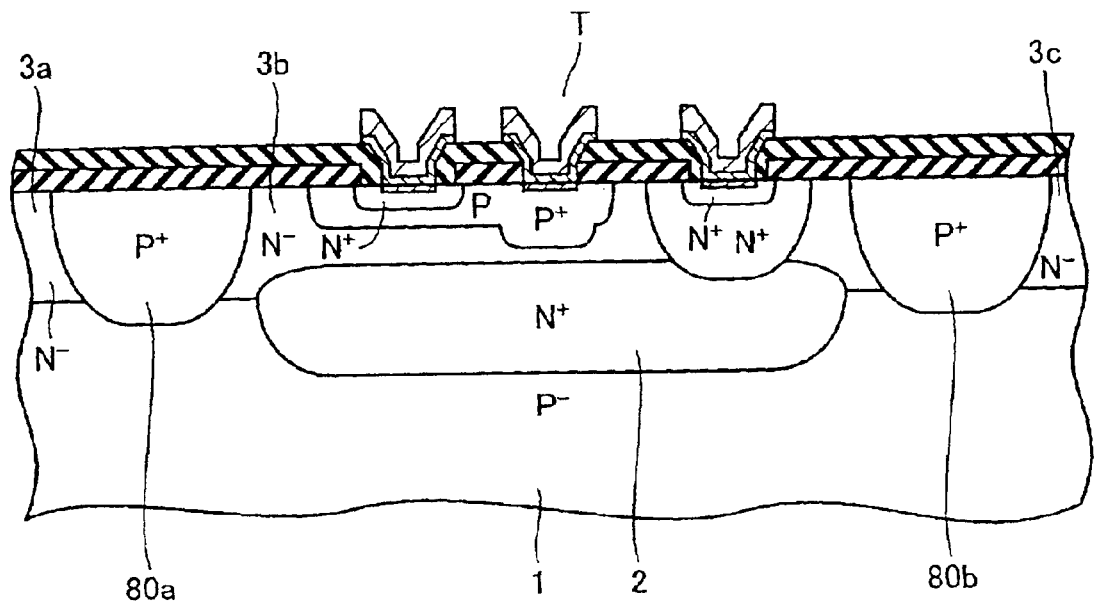
FIG. 59 is a cross sectional view including a PN isolation type transistor as a comparison for describing the effects of the semiconductor device shown in FIG. 58 according to Embodiment 7.
Figure 60:
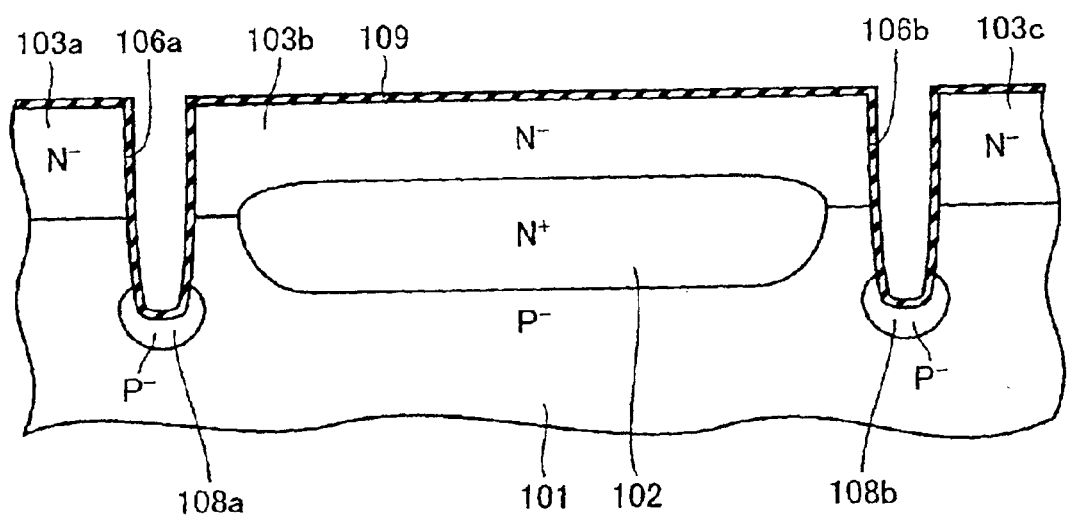
FIG. 60 is a cross sectional view showing one step of a manufacturing method for a semiconductor device according to a prior art.
Figure 61:
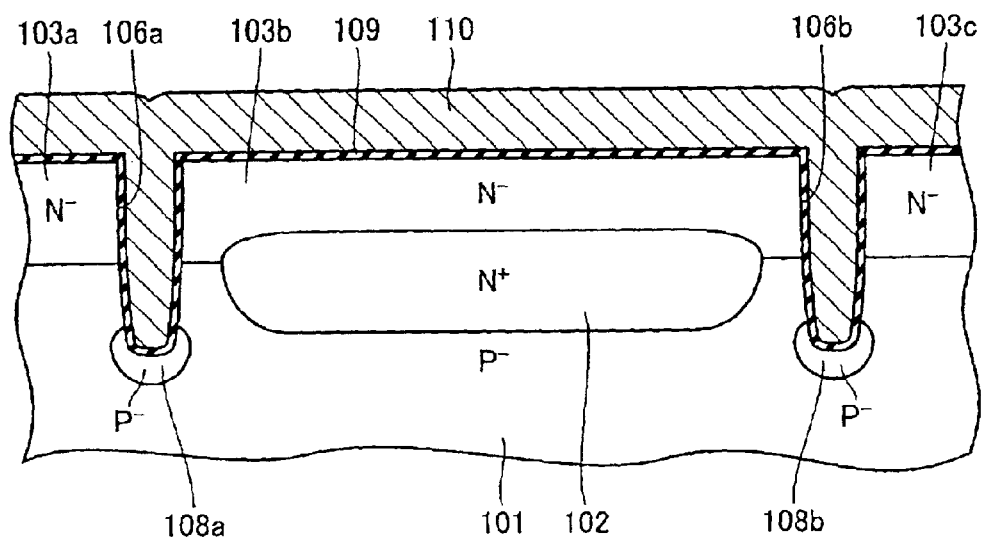
FIG. 61 is a cross sectional view showing a step that is carried out after the step shown in FIG. 60.
Figure 62:
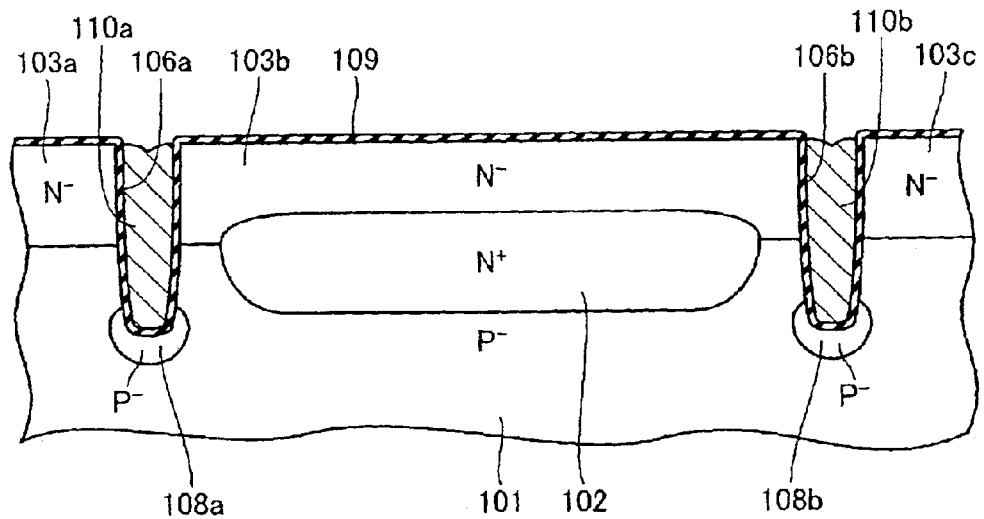
FIG. 62 is a cross sectional view showing a step that is carried out after the step shown in FIG. 61.

In contrast to this, in an NPN transistor according to an isolation structure based on the conventional PN junction, P⁺ isolation diffusion layers 80a and 80b are, respectively, formed in the respective spaces between epitaxial layers 3a to 3c for isolation as shown in FIG. 59.

Therefore, it is necessary to form contacts on P⁺ isolation diffusion layers 80a and 80b so as to secure the potential by providing aluminum electrodes on these portions in order to secure the potential of P⁻ type silicon substrate 1. Furthermore, such P⁺ type isolation diffusion layers need to be provided over the entirety of the substrate in order to secure the potential of P⁻ type silicon substrate 1 with respect to the entirety of the semiconductor device.

In the present semiconductor device, the potential of P⁻ type silicon substrate 1 can be directly secured via buried polysilicon film 10b formed in trenches 6a and 6b so that the semiconductor device can easily be fixed at the potential of P⁻ type silicon substrate 1.

Here, though in each of the above described embodiments polysilicon films are buried in the trenches, a semiconductor material, such as Si, Ge, or the like, may be used, in addition to the above, as long as the material has a coefficient of thermal expansion close to the value of the coefficient of thermal expansion of a silicon substrate.

Here, in the above described manufacturing method for a semiconductor device described in each of the embodiments, an NPN transistor is cited as an example of an element of the description. The present invention can be applied not only to an NPN transistor but, also, to a PNP transistor. In addition, the present invention can be applied to not only a bipolar transistor but, also, to a MOS transistor. Furthermore, it is clear that, the present invention can be applied to not only a transistor but, also, to another element.

The embodiments disclosed herein should be considered as illustrative from all points of view and are not limitative. The present invention is not defined by the above description but, rather, is defined by the claims and is intended to include the meanings equivalent to the claims as well as all of the modifications within the scope.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a semiconductor substrate of a first conductive type having a main surface;
    a layer of a second conductive type formed on said main surface of said semiconductor substrate;
    a trench portion, having sidewalls and a bottom, created so as to penetrate said layer of the second conductive type and so as to reach to a region in said semiconductor substrate for separating said layer of the second conductive type into one element formation region and another element formation region;
    an insulating film formed continuously on the sidewalls and bottom of said trench; and
    a buried semiconductor region formed on said insulating film so as to fill in said trench portion; wherein
    said insulating film is formed from the bottom over to the edges of the opening of said trench portion having an approximately uniform film thickness so as not to give any stress to said layer of the second conductive type, and an upper part of said trench portion is sandwiched by said layer of the second conductivity type.

2. The semiconductor device according to claim 1, wherein said insulating film includes a silicon oxide film.

3. The semiconductor device according to claim 2, wherein said insulating film includes an oxidation prevention film formed between said silicon oxide film and said buried semiconductor region.

4. The semiconductor device according to claim 3, wherein said oxidation prevention film is a silicon nitride film.

5. The semiconductor device according to claim 1, wherein said insulating film comprises an oxidation prevention film.

6. The semiconductor device according to claim 1, wherein a top surface of said layer of the second conductive type, an upper edge of said insulating film and a top surface of said buried semiconductor region are in approximately the same plane.

* * * * *